United States Patent [19]

Devendorf et al.

[11] 4,229,729
[45] Oct. 21, 1980

[54] ANALOG TO DIGITAL CONVERTER UTILIZING A QUANTIZER NETWORK

[75] Inventors: Don C. Devendorf; Eugene Baskevitch, both of Los Angeles, Calif.

[73] Assignee: Hughes Aircraft Company, Culver City, Calif.

[21] Appl. No.: 907,478

[22] Filed: May 19, 1978

Related U.S. Application Data

[63] Continuation of Ser. No. 650,820, Jan. 20, 1976, abandoned.

[51] Int. Cl.$^2$ .......................................... H03K 13/175
[52] U.S. Cl. ............................. 340/347 AD; 307/361; 340/347 M
[58] Field of Search .... 340/347 M, 347 AD, 347 CC; 307/218, 207, 289, 291, 238, 360, 361

[56] References Cited

U.S. PATENT DOCUMENTS

| | | | |
|---|---|---|---|
| 3,373,421 | 3/1968 | Wang | 340/347 DD |
| 3,539,831 | 11/1970 | Gilbert | 340/347 AD X |
| 3,544,779 | 12/1970 | Farrow | 235/311 |
| 3,573,798 | 4/1971 | Reiling | 340/347 AD |
| 3,585,631 | 6/1971 | McCown | 340/347 AD |
| 3,594,766 | 7/1971 | Gilbert | 340/347 AD |
| 3,597,761 | 8/1971 | Fraschilla et al. | 340/347 M |
| 3,611,350 | 10/1971 | Leibowitz et al. | 340/347 AD |
| 3,713,139 | 1/1973 | Sanford et al. | 235/92 GC X |
| 3,829,853 | 8/1974 | Freedman | 340/347 AD |
| 3,953,746 | 4/1976 | Fett | 307/238 X |
| 4,008,468 | 2/1977 | Imhoff et al. | 340/347 M X |

OTHER PUBLICATIONS

Schmid, Electronic Analog/Digital Conversions, Van Nostrand Reinhold Co., 1970, pp. 343-348.

*Primary Examiner*—Thomas J. Sloyan
*Attorney, Agent, or Firm*—W. H. MacAllister; W. J. Adam

[57] ABSTRACT

A quantizer network is disclosed for decoding an analog signal and providing a four-bit digital output. The analog input signal is divided or quantized into sixteen discrete voltage ranges and applied to sixteen differential amplifiers. Each amplifier has a different reference which must be exceeded before it provides an output signal. The sixteen differential amplifiers are connected to nine latch networks which respond to the signals from the amplifiers and provide a cyclic code in response thereto. The latch networks are connected to a network of logic gates which decode the cycle code into a four-bit digital output signal. The output signals from the logic gate network are applied to output stages which extend the valid time of the output signal from the logic gates.

11 Claims, 21 Drawing Figures

N = Number of Inputs
M = Position of Tap
R = Value of Reference Network Resistor

| Relation of Input Voltages | Current Level | |
|---|---|---|
| | X | Z |
| 1 < 3 | $I_0$ | $2 I_0$ |
| 1 = 3 | $3/2\ I_0$ | $3/2\ I_0$ |
| (2+3) > 1 > 2 | $2 I_0$ | $I_0$ |
| 1 = (2+3) | $3/2\ I_0$ | $3/2\ I_0$ |
| 1 > (2+3) | $I_0$ | $2 I_0$ |

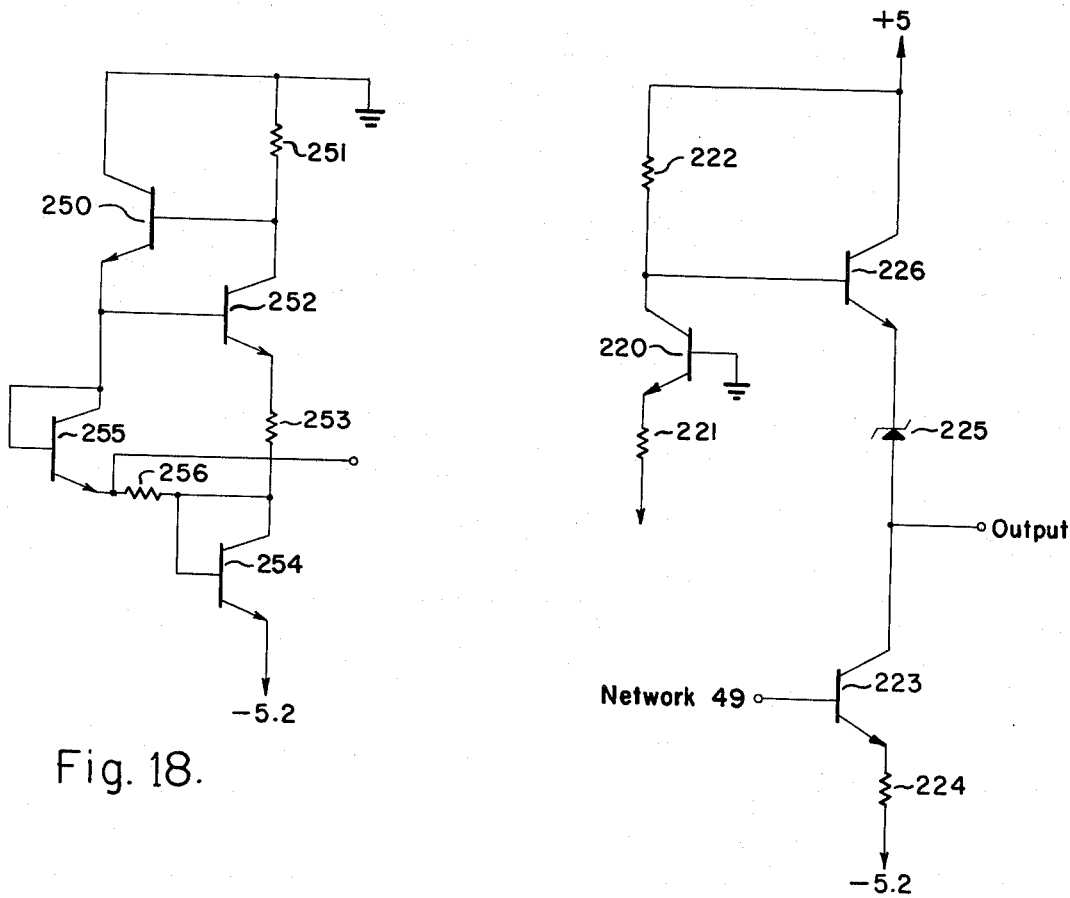
Fig. 18.
Fig. 17.
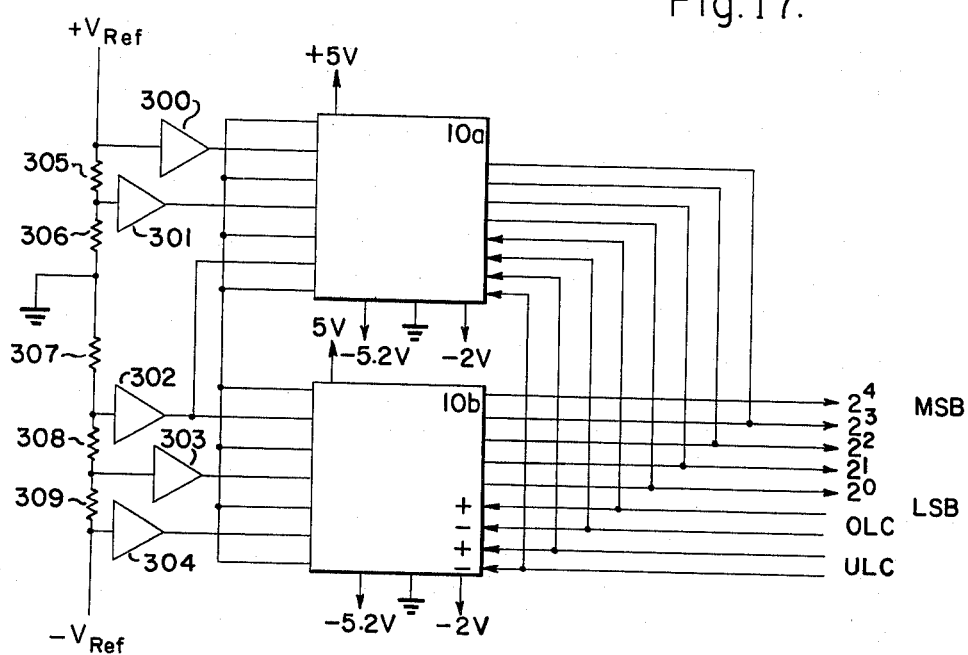
Fig. 19

ANALOG TO DIGITAL CONVERTER UTILIZING A QUANTIZER NETWORK

This is a continuation of application Ser. No. 650,820 filed Jan. 20, 1976, now abandoned.

FIELD OF THE INVENTION

This invention relates generally to analog-to-digital converters and more particularly to a quantizer network for decoding an analog input signal into a four-bit digital output, several of which quantizers may be used for providing a greater number of output bits.

DESCRIPTION OF THE PRIOR ART

Analog-to-digital converters generally utilize an analog reference signal which is subdivided into a set of $2^{N-1}$ voltage reference levels that are applied to respective comparator circuits. The voltage levels are separated by a voltage, Q, the quantizing level. Each comparator compares the analog input assigned to it, to the reference signal and if the input signal is above the reference, a logical "1" is produced. If the input signal is less than the reference, the comparator network provides a logical "0" output signal. The output signals of the comparator networks are applied to a decoder which forms a digital number at the encoder output. The digital number is uniquely generated for each quantizing level. The least significant bit in each number output corresponds to a quantizing level increment Q. In most A/D encoder configurations, the comparator is a key element and in fact is frequently a limiting factor that prevents the attainment of higher speeds and/or accuracy.

The process of comparison which takes place within the individual comparator networks is generally performed by a bi-stable circuit element. The conversion from an analog to digital signal is not completed until the bi-stable circuit has regenerated its output to a value compatible with the noise margin of the succeeding digital circuitry. This means that the ultimate encoding speed will be set by the regeneration time for the comparators output to reach a percentage of the output state which it should reach, via a "1" or "0" state. The regeneration time is dependent on the stochastic properties of the input analog sample, the circuit properties of the comparison circuit within the encoder, and the desired probability of not regenerating or being ambiguous.

If the regeneration cycle in the comparison circuit is not completed, it is possible for errors to occur in the digital circuitry attached to the ambiguous comparators output. Digital errors occur if more than one circuit is connected to the ambiguous comparator output and since different digital circuits respond differently to this non-digital (analog) ambiguous output, each of the circuit paths will interpret the signal differently. Thus, errors will result in output codes.

SUMMARY OF THE INVENTION

Accordingly, it is an object of the present invention to provide a high speed quantizer circuit for encoding an analog input voltage into a digital binary coded word.

It is another object of the present invention to provide a multi-bit analog-to-digital converter circuit utilizing a plurality of N-bit analog-to-digital converters (quantizers) interconnected in parallel, series, or series-parallel combinations.

It is another object of the present invention to provide a quantizer having high impedance, low input capacitance and requiring less power than A to D converters having equivalent performance.

It is still another object of the present invention to provide a quantizer having a variable encoding speed.

It is yet another object of the present invention to provide a quantizer having minimum regeneration times and propagation delays.

It is another object of the present invention to provide bias compensation for the "bowing" error caused by the bias currents of the individual input amplifiers.

In accordance with the foregoing objects, an N-bit analog-to-digital converter according to the present invention includes a voltage divider input network coupled to a plurality of $2^N$ differential amplifiers having individual reference threshold voltages. Each differential amplifier provides an output signal whenever its threshold level is exceeded. A bias compensation network is coupled to the voltage divider network for sensing the total bias current to the differential amplifiers and provides an approximately equal and opposite current for effectively cancelling the total bias current to the differential amplifiers. The differential amplifier networks are selectively coupled to a plurality of latch networks which generate a cyclic code in response to the differential amplifiers. The latch networks are selectively coupled to a plurality of logic gates for decoding the cyclic code to an N bit binary code. The logic networks are selectively coupled to a plurality of output level shift and data latch networks which provide multiple outputs at standard logic levels.

BRIEF DESCRIPTION OF THE DRAWINGS

FIG. 17 is a schematic circuit diagram illustrating an output latch clock driver network 48 for controlling the output latch networks 46a–46e.

FIG. 18 is a schematic circuit diagram illustrating a fourth type of bias network 49 used with the output latch networks 46a–46e.

FIG. 19 is a schematic block diagram of a 5-bit encoder.

DETAILED DESCRIPTION OF THE DRAWINGS

Figure 1:
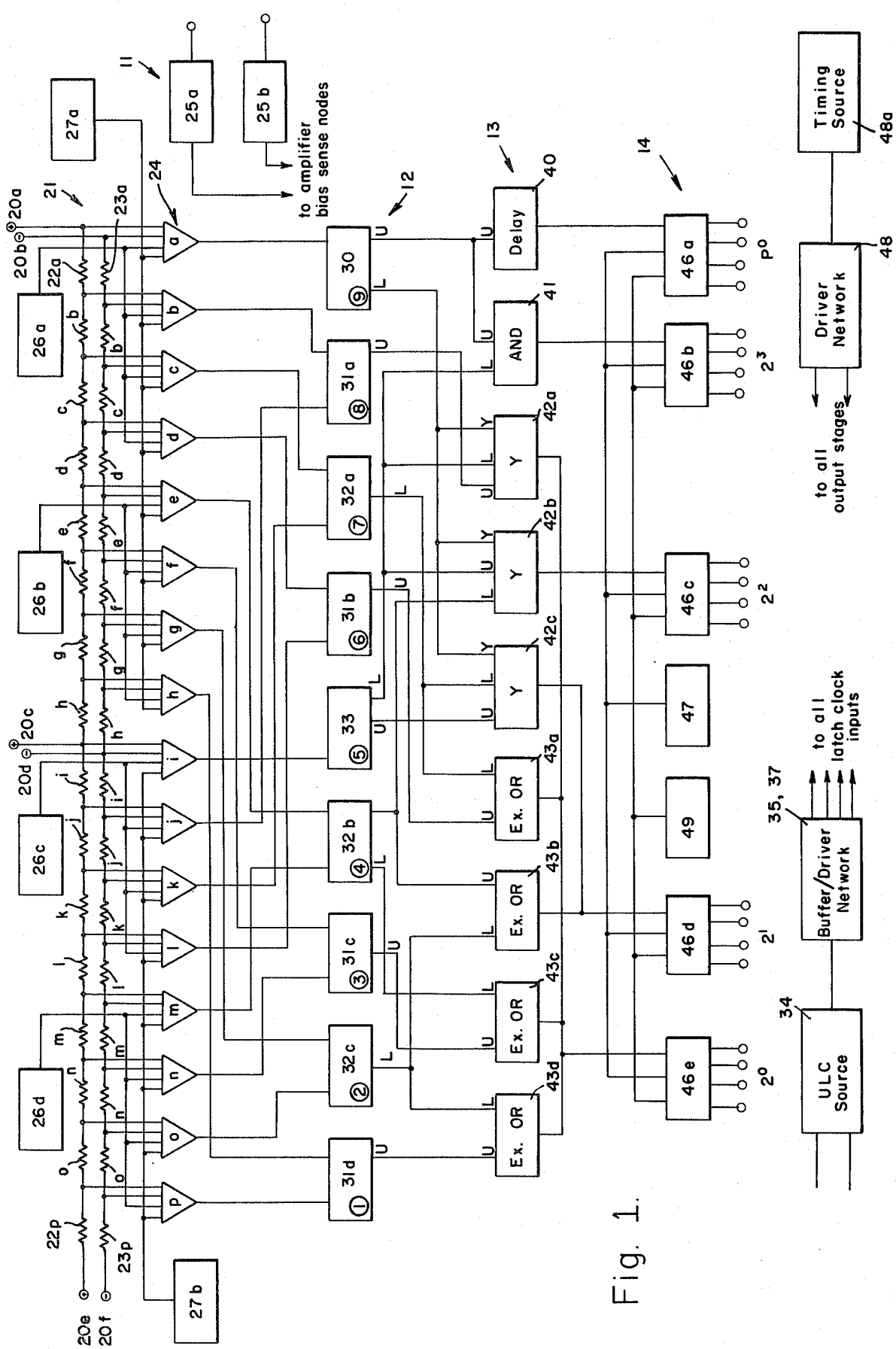
FIG. 1 is a schematic block diagram illustrating a preferred embodiment according to the present invention.

Referring more specifically to FIG. 1, an analog-to-digital converting system is disclosed utilizing a 4-bit analog-to-digital converter, hereinafter referred to as a quantizer network according to a preferred embodiment of the present invention, is now described. An input network 11 receives analog input signals from a signal source such as a radar receiver. The input network 11 includes sixteen identical amplifiers, to be further described below, which provide an interface between the analog input signals and the latching function which follows. The interface function of the input network 11 provides voltage gain, over-drive limiting, level shifting and common mode rejection. The performance of the input network 11 determines the resolution capabilities and the input response time of the A-to-D converter.

The output terminals of the input network 11 are connected to the input terminals of a first level decoding network 12 which includes nine latch networks and a latch driver network. The first level encode network 12 encodes and latches, or holds, the output signal from the input network 11 into a 9-bit cyclic code. Utilizing a 9-bit intermediate code significantly reduces the complexity of the subsequent encoding into a binary code. The circuit configuration of the latch networks within the first level decode network 12 has a minimum regeneration time constant such that an 8-bit resolution is provided at a 300 mega-sample second A/D encoding rate.

The output terminals of the first level encode network 12 are connected to the input terminals of a second level decode network 13 which includes a delay gate, an AND gate, a plurality of Y gates, and a plurality of exclusive-OR gates. The second level binary decoder network 13 converts the 9-bit intermediate code, generated by the first level encode network 12, to the required 4-bit binary code. In addition, the network 13 also provides an output signal representing the position bit.

The output terminals of the second level encode network 13 are connected to the input terminals of an output network 14 which latches the input signal from the second level decoder and elongates the output data valid time.

Referring more specifically to the input network 11 in greater detail, input terminals 20a and 20b receive the analog input signals and provide them to a differential voltage divider network 21 and to a first differential amplifier 24a in the input amplifier network 24. The voltage divider network 21 includes a first network of serially connected matched resistors 22a–22p and a second network of serially connected matched resistors 23a–23p. The first differential input terminal 20a is connected to the first terminal of the resistor 22a and to the first input terminal of the first differential amplifier 24a.

The first terminal of the second resistor 22b of the second network 22 is connected to the first input terminal of the second differential amplifier 24b. Similarly, the first terminals of the resistors 22c–22p are connected to the first input terminals of the third through sixteenth differential amplifiers 24c–24p, respectively.

The second differential input terminal 20b is connected to the first terminal of the resistor 23a and to the second input terminal of the first differential amplifier 24a. The first terminal of the second resistor 23b is connected to the second input terminal of the second differential amplifier 24b. Similarly, the first terminals of the third through sixteenth resistors 23c–23p are connected to the second input terminals of the third through sixteenth differential amplifiers 24c–24p, respectively.

In order to achieve the high operating speeds of 300 MHz., additional differential input terminals must be used to minimize the settling time of the input network 21. Thus, the second and third pairs of differential input terminals are provided to the amplifier network 24. The first input terminal 20c of the second pair of differential input terminals is connected to the junction of the matched resistors 22h and 22i and to the first input terminal of the differential amplifier 24i. The second input terminal 20d of the second pair is connected to the junction of matched resistors 23h and 23i and to the second input terminal of the input amplifier 24i. The first input terminal 20e of the third pair of differential input terminals is connected to the second terminal of the resistor 22p while the second input terminal 20f is connected to the second terminal of the resistor 23p.

Different reference voltages are applied to the second, or negative, input terminals of the differential input pairs 20b, d and f, while the same analog signal is applied to the three first, or positive, input terminals of the differential input pairs. Applying different reference voltages to the different terminal pairs and applying the same analog input signal reduces the input inductance and reduces the settling time of the resistive networks 22 and 23. In addition, the cumulative effect of resistive tolerances of the individual resistors within the first and second resistive networks 22 and 23 is significantly reduced.

Figure 2:
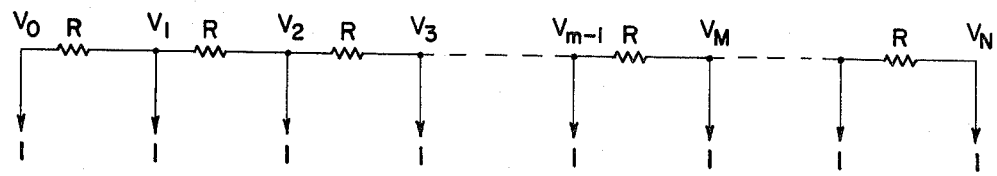
FIG. 2 is a circuit schematic diagram illustrating a reference network equivalent circuit for calculating the "bow error" of the input voltage divider network illustrated in FIG. 1.

Referring briefly to FIG. 2, a reference network equivalent circuit is now described. The resistor networks 22 and 23 may be represented by the equivalent circuit of FIG. 2. A "bow" error voltage which would otherwise be present in the resistive networks 22 and 23 is eliminated by utilizing matched resistors in both networks 22 and 23. Utilizing matched resistors in the two resistive networks 22 and 23 results in cancelling of the "bow" error by uniformally distributing the input bias currents to the differential amplifiers 24a-24p.

In the analysis of the general equivalent circuit shown in the figure, it can be shown that the "bow" error voltage can be eliminated. The equivalent circuit is a plurality of N equal resistors connected between two voltages $V_O$ and $V_N$. At each junction of two resistors a current I is supplied. If M represents the tap number commencing at M=0 at $V_O$, then it can be shown that the voltage at any tap on the series connected resistors:

$$V_M = RI \left[ \sum_{J=1}^{M} \left( \sum_{i=0}^{J-1} \left( \frac{i}{N} \right) - \sum_{i=J}^{N} \left( \frac{N-i}{N} \right) \right) \right] + \frac{M}{N}(V_n - V_o) + V_o$$

The two terms on the far right of the expression are the linear voltage divider terms. The large term in brackets is the "bow" error term. Since the input terminals receive differential input signals, each amplifier has a differential voltage applied thereto which is the difference between this particular input reference voltage and its particular input signal voltage. The voltages $V_N$ and $V_O$ are applied to the N points of the reference resistive network which applies the reference voltages to the respective input amplifiers 24a-24p. Each current I to the input terminals of the differential amplifiers 24a-24p is identical and $V_O = V_N = N_{in}$, where $V_N$ is connected to the positive input terminals of the resistive network 22. Since each amplifier receives a differential voltage from respective resistors in the first and second resistive networks 22 and 23, the "bow" error cancels as shown below:

$$V_M(+) = RI \text{ [Bow Error]} + V_{in}$$
$$V_M(-) = RI \text{ [Bow Error]} + \frac{M}{N}(V_N - V_o) + V_o$$
$$V_M(+) - V_M(-) = V_{in} - \frac{M}{N}(V_N - V_o) + V_o$$

The cancellation of the "bow" error is limited by the matching tolerance of all the parameters of the resistors in both resistive networks 22 and 23.

Referring again to FIG. 1, the analog input network 11 further includes a bias current compensation network comprising first and second current mirror networks 25a and 25b connected to the bias sensing terminals of the differential amplifiers 24a-24p. The networks 25a and 25b provide bias compensation such that the same bias currents are provided to each of the input amplifiers 24a-24p. The current mirror network 25a senses the positive input bias current and provides an essentially equal and opposite current to the amplifiers 24a-24p, thus cancelling the net bias current. The current mirror senses the negative input bias current and likewise provides an opposite current to the differential amplifiers.

The current mirror networks 25a and 25b and the input amplifiers 24a-24p are described in greater detail below in FIG. 3.

A first type of bias network 26a is connected to the first bias terminals of the amplifiers 24a-24d. The network 26a determines the operating speed of the quantizer by selectively providing different bias currents to the amplifiers. The lower the current that is provided by the network 26a, the lower the operating speed of the quantizer; and conversely, the greater the current, the higher the speed of the quantizer. The bias network 26a is described in greater detail in FIG. 4.

A second bias network 26b, identical to the network 26a, is connected to the first bias terminals of the differential amplifiers 24e-24h. A third bias network 26c, identical to the network 26a, is connected to the first bias terminals of the differential amplifiers 24i-24l, and a fourth bias network 26d, identical to the network 26a, is connected to the first bias terminals of the differential amplifiers 24m-24p.

A second type of network 27a is connected to the second bias terminals of the differential amplifiers 24a-24h. Network 27a provides the differential amplifiers 24a-24h with the bias voltage required to set the logical zero output level of the amplifiers. A second bias network 27b identical to the first bias network 27a is connected to the second bias terminals of the differential amplifiers 24i-24p. The second type of bias network is described in greater detail below with reference to FIG. 5.

Referring now to the first level decode network 12, the latch networks therein generate a 9-bit cyclic code in response to the output signals from the differential amplifiers 24a-24p. The latch networks are essentially bi-stable circuits having upper and lower current switching sections. As will be shown, several of the latch networks have a first output state in response its respective amplifiers not having had their thresholds exceeded. There is a first transition from a first output state to a second output state when the threshold of the first amplifier is exceeded. Then there is a second transition from the second output state to the first output state as the threshold of the second amplifier is exceeded. Thus one latch combines the functions of two latches in the prior art A to D converters. Latch networks 31a-c, and 32a-d operate as described above.

The latch networks 30 and 33 have only one transition in response to input signals from their respective differential amplifiers.

The output terminals of the differential amplifier 24a are connected to the input terminals of a first type of latch network 30. The latch network 30 provides a logic "0" output signal when the threshold of the differential amplifier 24a has not been exceeded and a logic "1" state when the threshold of amplifier 24a has been exceeded. The circuit of the latch network 30 is described in greater detail in FIG. 9.

The output terminal of the second differential amplifier 24b is connected to the first input terminal of a second type of latch network 31a. The output terminal of the tenth differential amplifier 24j is connected to the second input terminal of the latch network 31a. The latch network 31a initially provides a logic "0" output signal in response to an analog input signal which does not exceed the threshold levels of the amplifiers 24b and 24j. When the threshold of the amplifier 24j is exceeded the latch 31a provides a logic "1" output signal. Then when the threshold of the amplifier 24b is exceeded also the latch provides a logic "0" output signal. A detailed description of the latch network 31a may be found below in FIG. 7.

The third amplifier network 24c is connected to the first input terminal of a latch network 32a. An eleventh amplifier 24k is connected to the second input terminal of the latch 32a. The operation of the latch network 32a is similar to the operation of the network 31a, briefly described above. Thus two output states are provided in response to the states of the differential amplifiers 24c and 24k. The major operational difference between the latch network 31a and 32a are the output levels. Structurally additional components are utilized in order to provide the level shifted output signals. The schematic circuit diagram of the latch network 32a may be found in FIG. 8.

The fourth amplifier 24d is connected to the first input terminal of a second latch network 31b. The output terminal of the twelfth amplifier 24e is connected to the second input terminal of the latch network 31b, identical to the latch network 31a.

The ninth amplifier network 24i is connected to the input terminal of a fifth latch network 33. The structure and function of the network 30 are similar to those of the latch network 30. A detailed description of the latch network 33 may be found in FIG. 6.

The fifth amplifier network 24e is connected to the first input terminal of a sixth latch network 32b. The thirteenth amplifier 24m is connected to the second input terminal of the latch network 32b, identical to the latch network 32a.

The sixth amplifier network 24f is connected to the first input terminal of a seventh latch network 31c. The fourteenth amplifier 24n is connected to the second input terminal of the latch network 31c, identical to the latch network 31a.

The seventh amplifier network 24g is connected to the first input terminal of an eighth latch network 32b. The fifteenth amplifier 24o is connected to the second input terminal of the latch network 32b, identical to the latch network 32a.

The eighth amplifier 24h is connected to the first input terminal of a ninth latch network 31d. The sixteenth amplifier 24p is connected to the second input terminal of the latch network 31d, identical to the latch network 31a.

An unlatch clock (ULC) buffer network 35 receives latch and unlatched signals from a source of timing signals 34. The first output terminal of the buffer 35 is connected to the input terminal of the unlatch driver network 37. The first output terminal, labeled $\overline{LT}$, of the unlatch driver network 37 is connected to the control terminals of the latch networks. The second output terminal, labeled LT, of the unlatch driver network 37 is connected to the control terminals of the latch networks.

The first output terminal of the latch network 30, labeled U, is connected to the input terminal of a delay gate 40, and to the first input terminal of an AND gate 41. The second output terminal of the latch network 30, labeled L, is connected to the first input terminals, labeled Y, of first, second, and third Y gates, 42a, 42b, and 42c.

The output terminal of the second latch network 32a is connected to the third input terminal, labeled U, of the first Y network 42a.

The output terminal of the third latch network 32a is connected to the second terminal, labeled L, of the third Y gate 42c and to the second input terminal of a first EXCLUSIVE-OR logic gate 43a. The fourth latch network 31b is connected to the first input terminal of the first EXCLUSIVE-OR logic network 43a.

The first output terminal, labeled U, of the fifth latch network 33 is connected to the first input terminal, labeled U, of the third Y logic gate 42c. The second output terminal, labeled L, of the latch network 33 is connected to the second terminal, labeled L, of the AND logic gate 41. The second output terminal of the latch 33 is also connected to the second terminals, label L, of the Y logic gates 42a and 42b. The first output terminal of the sixth latch network 32b is connected to the first input terminal, labeled U, of the second Y logic gate 42b and to the first input terminal, labeled U, of the second EXCLUSIVE-OR logic gate 43b. The second output terminal, labeled L, of the latch network 32b is connected to the second input terminal, labeled L, of a third EXCLUSIVE-OR logic gate 43c.

The output terminal of the seventh latch network 31c is connected to the first input terminal, labeled U, of the EXCLUSIVE-OR logic gate 43c.

The output terminal of the eighth latch network 32c is connected to the second input terminals, labeled L, of the second and fourth EXCLUSIVE-OR logic gates 43b and 43d. The output terminal of the ninth latch network 31d is connected to the first input terminal, labeled U, of the fourth EXCLUSIVE-OR logic gate 43d.

The logic gates 41, 42a-c, and 43a-b are described in greater detail below.

The output terminals of the first Y gate 42a, the first, third and fourth EXCLUSIVE-OR logic gates 43a, 43c and 43d are connected together in a wired-OR logic configuration and provide the least significant output bit $2^0$.

The output terminals of the third Y logic gate 42c and the second EXCLUSIVE-OR logic gate 43b are connected together in a wired-OR configuration and provide the next least significant bit $2^1$.

The output terminal of the second Y logic gate 42b provides the next significant bit $2^2$. The output terminal of the AND logic gate 41 provides the most significant bit $2^3$. The gate 40 provides a single-stage delay for the output state of the latch 30 for matching the stage delays of the other logic gates. The gate 40 provides the position bit output of the quantizer which is utilized whenever several quantizers are used in combination and the capacity of the quantizer is exceeded. The gate 40 will then provide a logic "1" output state. The gate 40 is optional and need not be used if a single quantizer is used as a four-bit analog-to-digital converter.

In order to match the logic levels of the second decode network 13 to the output levels required, such as required to drive MECL 10K technology ECL circuits, output states such as 45a-45e are connected to gate network 13. The output networks supply the required level shifting for interfacing with standard MECL 10K type circuitry. The output logic "swing" is controlled by an internal drive circuit within the various output stages or networks. The network 14 provides data latching of the output signal from the second level decoding network 13, i.e. the output signal from the network 14 has a greater duration than the input signal. In addition, each output stage provides a plurality of identical output terminals which allow the use of independent external wired-OR interconnections. An example of such interconnection is the case of utilizing two 4-bit quantizers to form a 5-bit A/D converter as is described in FIG. 19.

The operation of the quantizer or analog-to-digital converter circuit according to FIG. 1 is now discussed with reference to that figure and with reference to Table I below. The circled numerals within the latch networks correspond to the latch numbers on the table. Different reference level voltages are applied to the three reference input terminals 20b, 20d, and 20f, such as 1.5 V, 0 V, and −1.5 V, respectively, which set the reference levels for the individual differential amplifiers 24a-24p. The minimum range of reference level voltages that may be applied to the input reference terminals is limited by fabrication technology and is currently 130 millivolts. The input terminals 20a, 20c, and 20e are connected together and receive a common analog input signal. The two series resistor networks 22 and 23 correct for the "bowing" error described above in FIG. 2. The current mirror networks 25a and 25b provide bias compensation by sensing the current demands of the input amplifiers 24a-14p and provide a current that approximately cancels the total input current accordingly.

For purposes of discussion assume that the analog input voltage is −1.5 V and gradually increases to +1.5 V with time. Initially, the thresholds of the amplifiers 24a-24p are not exceeded and all the amplifiers provide negative differential output signals to the latch networks in the first level decode network 12. The latch network 12 receives clock signals and provide a "0" logic state output signal to the logic gates in the second encode level network 13 which also provide a "0" logic state output signal. Thus the analog input signal of −1.5 V corresponds to a "0" logic state.

As the input voltage becomes more positive than the reference voltage, the amplifier 24p provides a positive differential output signal to the latch 31d. The output signal from the latch 31d changes state to a logic "1" which is applied to the EXCLUSIVE-OR gate 43d. The gate 43d also changes state and provides a logic "1" output state. The output state of gate 46e, in response to the gate 43d and clock signals from the driver network 48, also provides a logic "1" output state which is extended in time. The Table I illustrates the output signal at the line entitled Threshold 2.

Similarly as the threshold of the amplifier 24o is exceeded, the latch network 32c provides a "1" logic output state to EXCLUSIVE-OR gates 43b and 43d.

As the analog input voltage increases further, the threshold of a second amplifier 24o is exceeded also and provides a positive differential output signal to the latch network 32c. The latch 32c, in turn, provides a logic "1" output state to the EXCLUSIVE-OR gates 43b and 43d. The gate 43d responds by providing a "0" output state to the output stage 46e. The gate 43b provides a logic "1" output state to the output stage 46d. Table 1 illustrates the result.

Thus as the analog input voltage rises, the thresholds of additional differential amplifiers are exceeded and positive differential output signals are provided thereby. The latch networks responds by providing appropriate logic "1" to "0" output signals to the logic gates.

It is pointed out that the latch networks generate a cyclic code as the first level encodes function. The utilization of such a intermediate code simplifies the overall circuit by requiring fewer latch networks than prior art analog-to-digital converters. Most analog-to-digital converters require 16 latch networks to encodes an analog signal into a 4-bit digital output signal. As is evident from the above discussion, only 9 latch networks are necessary in the present scheme for providing a 4-bit output signal.

TABLE I

| THRESHOLD NUMBERS | ⑨ | ⑧ | ⑦ | ⑥ | ⑤ | ④ | ③ | ② | ① | P | $2^3$ | $2^2$ | $2^1$ | $2^0$ |
|---|---|---|---|---|---|---|---|---|---|---|---|---|---|---|
| 1  | 0 | 0 | 0 | 0 | 0 | 0 | 0 | 0 | 0 | 0 | 0 | 0 | 0 | 0 |
| 2  | 0 | 0 | 0 | 0 | 0 | 0 | 0 | 0 | 1 | 0 | 0 | 0 | 0 | 1 |
| 3  | 0 | 0 | 0 | 0 | 0 | 0 | 0 | 1 | 1 | 0 | 0 | 0 | 1 | 0 |
| 4  | 0 | 0 | 0 | 0 | 0 | 0 | 1 | 1 | 1 | 0 | 0 | 0 | 1 | 1 |
| 5  | 0 | 0 | 0 | 0 | 0 | 1 | 1 | 1 | 1 | 0 | 0 | 1 | 0 | 0 |
| 6  | 0 | 0 | 0 | 0 | 1 | 1 | 1 | 1 | 1 | 0 | 0 | 1 | 0 | 1 |
| 7  | 0 | 0 | 0 | 1 | 1 | 1 | 1 | 1 | 1 | 0 | 0 | 1 | 1 | 0 |
| 8  | 0 | 0 | 1 | 1 | 1 | 1 | 1 | 1 | 1 | 0 | 0 | 1 | 1 | 1 |
| 9  | 0 | 1 | 1 | 1 | 1 | 1 | 1 | 1 | 1 | 0 | 1 | 0 | 0 | 0 |
| 10 | 0 | 1 | 1 | 1 | 1 | 1 | 1 | 1 | 0 | 0 | 1 | 0 | 0 | 1 |
| 11 | 0 | 1 | 1 | 1 | 1 | 1 | 1 | 0 | 0 | 0 | 1 | 0 | 1 | 0 |
| 12 | 0 | 1 | 1 | 1 | 1 | 1 | 0 | 0 | 0 | 0 | 1 | 0 | 1 | 1 |
| 13 | 0 | 1 | 1 | 1 | 1 | 0 | 0 | 0 | 0 | 0 | 1 | 1 | 0 | 0 |
| 14 | 0 | 1 | 1 | 1 | 0 | 0 | 0 | 0 | 0 | 0 | 1 | 1 | 0 | 1 |
| 15 | 0 | 1 | 1 | 0 | 0 | 0 | 0 | 0 | 0 | 0 | 1 | 1 | 1 | 0 |
| 16 | 0 | 1 | 0 | 0 | 0 | 0 | 0 | 0 | 0 | 0 | 1 | 1 | 1 | 1 |
|    | 1 | 1 | 0 | 0 | 0 | 0 | 0 | 0 | 0 | 1 | 0 | 0 | 0 | 0 |

Figure 3:
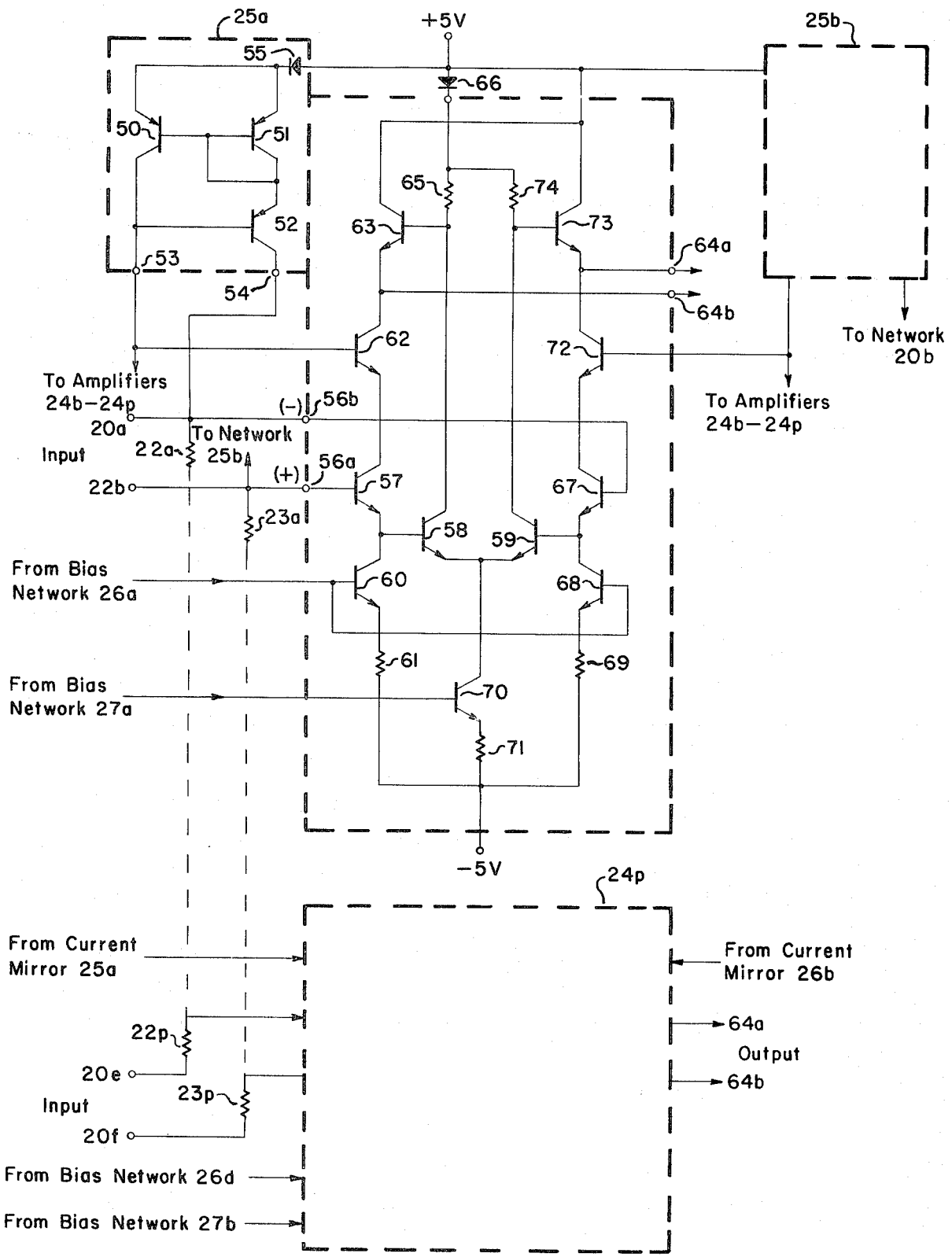
FIG. 3 is the interconnection of networks 24a–24p schematic circuit diagram illustrating a bias compensation networks 25a and 25b, input networks 22a–22p and 23a–23p and an input amplifier of FIG. 1.

$P = \overline{9}$
$2^3 = 5 . \overline{9}$
$2^2 = (4 \oplus 5) . \overline{9}$
$2^1 = (2 \oplus 4) + (5 \oplus 7) . \overline{9}$
$2^0 = (1 \oplus 2) + (3 \oplus 4) + (6 \oplus 7) + (5 \oplus 7) . \overline{9}$ Referring more specifically to FIG. 3, there is shown a differential input amplifier 24a and the current mirror 25a. The current mirror includes first, second and third transistors 50, 51 and 52 wherein the first and second transistors 50 and 51 are connected together at their base electrodes. The transistors 50 and 51 are also connected at their emitter electrodes. The collector electrode of the transistor 50 is connected to the base electrode of the transistor 52. The collector electrode of the diode connected transistor 51 is connected to the emitter electrode of the transistor 52. The collector electrode of the transistor 50 is connected to the cathode electrode of a Schottky diode 55, whose anode is connected to the reference voltage. The collector electrode of the transistor 52 is connected to an input terminal 54.

The current mirror 25b is identical to the current mirror 25a and therefore will not be described in detail.

The differential input amplifier 24a is now described in detail. The differential analog signal is applied to the input terminals 56a and 56b, labeled positive and negative respectively. The positive input terminal 56a is connected to the base electrode of an input emitter follower transistor 57. The emitter electrode of the transistor 57 is connected to the base electrode of a first transistor 58a of a pair of differential transistors. The emitter electrode of the transistor 57 is connected to the collector electrode of a current source transistor 60. The base electrode of the transistor 60 is connected to the bias network. A resistor 61 connects the emitter electrode of the transistor 60 to ground or reference level voltage such as −5 V.

The collector electrode of the transistor 57 is connected to the emitter electrode of a signal isolation transistor 62. The base electrode of the transistor 62 receives a bias current from the bias compensation network 25a. The collector electrode of the transistor 62 is connected to the emitter electrode of an output emitter follower transistor 63. The collector electrode of the transistor 62 is also connected to the output terminal 64b of the differential output terminal pair. The base electrode of the transistor 63 is connected to the first terminal of the resistor 65. The second terminal of the resistor 65 is connected to the cathode electrode of a diode 66. The anode of the diode 66 is connected to a bias voltage such as +5 V. The collector electrode of the transistor 63 is connected to the positive bias voltage.

The second input terminal 56b is connected to the base electrode of an input emitter follower transistor 67. The emitter electrode of the transistor 67 is connected to the base electrode of the second transistor 59 of a differential pair of transistors (items 58 and 59). The emitter electrode of the transistor 67 is also connected to the collector electrode of a current source transistor 68. The base electrode of the transistor 68 is connected to the bias network 26a. The emitter electrode of the transistor 68 is connected to a reference level voltage through a resistor 69.

The collector electrode of the transistor 67 is connected to the emitter electrode of a signal isolation transistor 72. The base of the transistor 72 is connected to the current mirror network 25b. The collector electrode of the transistor 72 is connected to the emitter electrode of an output emitter follower transistor 73. The collector electrode of the transistor 72 is connected to the differential output terminal 64a. The base electrode of the transistor 73 is connected to the collector electrode of the transistor 58b and to the first terminal of a bias resistor 74. The second terminal of the resistor 74 is connected to the cathode electrode of the diode 66.

The emitter electrodes of the matched pair of differential transistors 58a and 58b are connected to each other and to the collector electrode of a current source transistor 70. The emitter electrode of the transistor 70 is connected to the reference level voltage through a resistor 71. The base electrode of the transistor 70 is connected to the bias network 27a.

The differential input amplifiers 24b–24p are identical to the differential input amplifier 24a and therefore will not be described in detail.

The operation of the differential input amplifier 24a and the current mirror networks 25a and 25b are now described with reference to FIG. 3.

A bias voltage is applied to the base electrodes of the transistors 60 and 68 by the bias network 26a. Transistors 60 and 68 form, with resistors 61 and 69, a constant current source. The constant current flows from the emitter electrode of the transistor 57 to the collector of transistor 60 with a small current to the transistor 58a. The transistor 62 provides the the constant current to the transistor 60 plus the small current current flowing to the transistor 58a. The base of transistor 62 is connected to the summing junction of the current mirror 25a which provides a reference level voltage and also senses the current flowing into the base of transistor 62. The emitter current of transistor 62, large compared to the current flowing in the base of transistor 62, then flows in the collector electrode of the transistor 62. This collector current is then drawn out the emitter of transistor 63 which is primarily supplied through the collector of transistor 63, and ultimately the reference level voltage.

The series network at the right-hand side of the differential amplifier is the mirror image of the series network just described, and therefore will not be described in detail.

The positive and negative input signals are applied to the base electrodes of level shift transistors 57 and 67, respectively. The transistors 57 and 67 reduce the input impedance to the base electrodes of the differential transistor pair 58a and 58b. A constant current is drawn from the emitter electrodes of the differential pair 58a and 58b by a constant source, transistor 70. The constant current is channeled through transistors 58a and 58b, the amounts through each transistor being proportional to the difference of the voltages on the base electrodes of transistors 58a and 58b. The constant current is drawn into the collector electrodes of transistors 58a and 58b out of resistors 65 and 74, respectively. The currents flowing through the resistors 65 and 74 generate a differential voltage which is applied to the base electrodes of transistors 63 and 73 in proportion to the input voltage. Transistors 63 and 73 provide a level shifting and impedance reduction. The resulting output signal from the transistors 63 and 73 is applied to the latch network 14. The voltage range of the output signal is approximately +3.3 volts to +3.0 volts.

Referring more specifically to the operation of the current mirror network 25a, the base electrode of transistor 62, of the amplifiers 24a through 24p, draws current through the node 53. Initially, current is drawn through the base electrode of transistor 52 which causes the flow of collector current through transistor 52 and, subsequently, transistor 51. There is a base-emitter voltage drop in transistor 50 since the base and collector electrodes of two transistors are connected together. The collector current of transistors 50 and 51 will then be equal. The currents flowing out of nodes 53 and 54 will then differ by $1/\beta^2$ times the currents, an error of less than 1%. The current flowing out of the node 54 is summed into the transistor 57 in all the input amplifiers. From the discussion of operation of the input amplifier, it was noted that the currents, flowing through the collectors of transistors 62 and 57 are nearly equal, so that the base currents will be equal as well. Therefore, the input current to the input amplifier is compensated for by summing in a current from the current mirror. The current mirror 25b is similar in operation to 25a and will not be discussed in detail.

Figure 4:
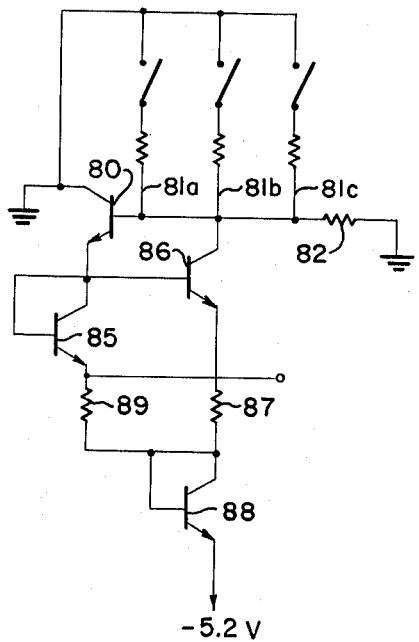
FIG. 4 is a schematic circuit diagram of a first type of bias network 26a–26d shown FIG. 1.

Referring now to FIG. 4, a bias network 26a is now described. The collector electrode of a transistor 80 is connected to ground potential. The base electrode of the current to the transistor for a lower operating speed. The lower the resistance value between the base electrode and reference level, the higher the currents to the transistor 80 for a higher operating speed. The control network 84 selectively controls the switch sections a, b and c.

The emitter electrode of the transistor 80 is connected to the collector electrode of a diode connected transistor 85 and to the base electrode of a transistor 86. The collector electrode of the transistor 86 is connected to the junction of the resistors 81a, b and c. The emitter electrode of the transistor 86 is connected to the first terminal of a resistor 87. The second terminal of the resistor 87 is connected to the collector electrode of a transistor 88. The emitter electrode of the transistor 85 is connected to the collector electrode of the diode connected transistor 88 through a resistor 89 and to an output terminal. The emitter electrode of the transistor 88 is connected to a bias voltage such as −5.2 V.

The operation of the bias network 26a according to FIG. 4 is now described with reference to that figure.

The bias network 26a generates a voltage at its output that controls the magnitude of the current in the input differential amplifiers 24a–24p. Thus this bias circuit controls the output voltage of the amplifiers. The transistor 88 compensates for changes in base-to-emitter voltage that occur in the current source transistors 60 and 68 in FIG. 3 as a function of temperature and processing tolerances. Transistors 86 and 80 are connected to form a low gain negative feedback voltage source. The output of the negative feedback source is from the emitter electrode of transistor 80 which provides a low output impedance. Transistor 86 is a degenerated grounded emitter inverting amplifier which controls the output voltage and provides the negative feedback from the emitter of transistor 80 to further reduce its output impedance. The output voltage of the source is controlled by the ratio of resistor 81 to resistor 87, and the voltage drops across three base emitter junctions (transistors 88, 86, and 80) and the negative supply voltage (−5.2 V). The output voltage is level shifted by the diode connected transistor 85, and biased with a current controlled by resistor 89. The output voltage of the circuit is set to be approximately 1.35 V more positive than the −5.2 V supply making its output ≈ −3.85 V.

Figure 5:
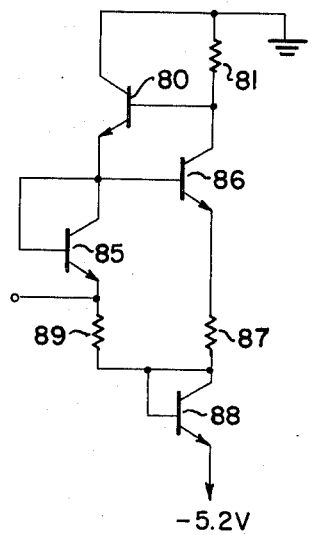
FIG. 5 is a schematic circuit diagram of a second type of bias network 27a and 27b shown in FIG. 1.

Referring more specifically to FIG. 5, a bias network 27a is now briefly described. The circuit configuration of the bias networks 26a and 27a are identical except for the network 27a having only one resistor 81. Therefore the same reference identification numerals apply to the circuit of FIG. 5. The difference between the two networks 26a and 27a is the output voltage level.

The operation of the bias network 27a according to FIG. 5 is identical to the operation of the bias network 26a and therefore the discussion of FIG. 4 should be consulted.

Figure 6:
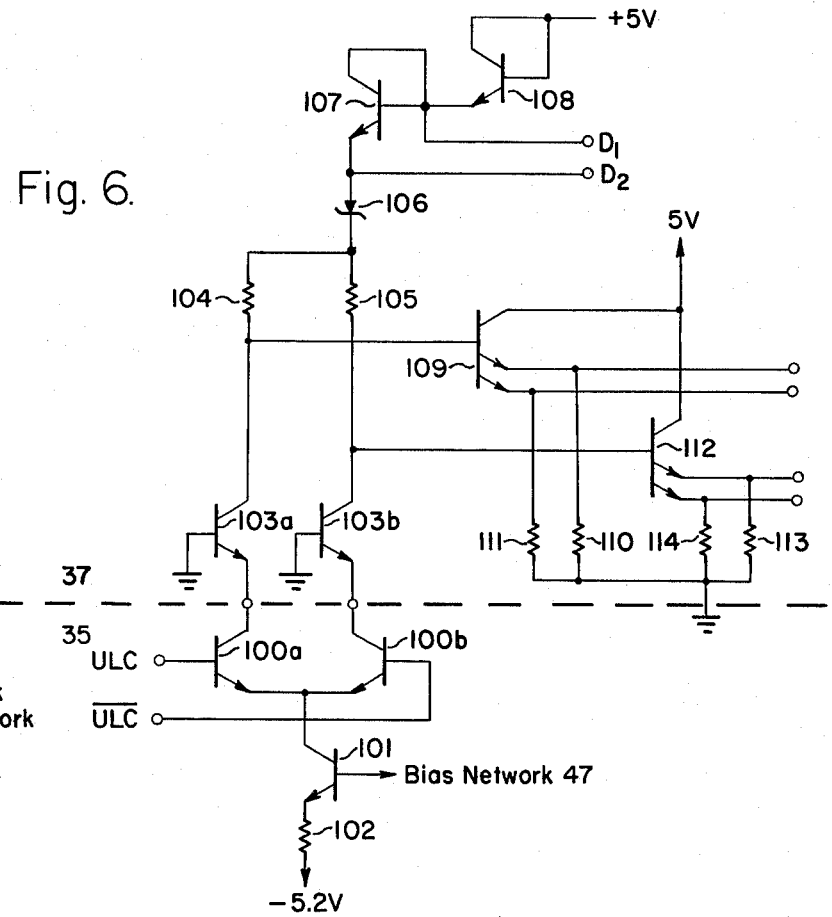
FIG. 6 is a schematic circuit diagram of an unlatch driver network and a buffer network according to FIG. 1.

Referring now to FIG. 6, a buffer network 35 and an unlatch driver network 37 are now described. More specifically, in the buffer 35 the base electrodes of a pair of differential transistors 100a and 100b receive the clock signals from a clock network. The emitter electrodes of the transistors 100a and 100b are connected together and to the collector electrode of a transistor 101. The base of the transistor 101 is connected to a bias network 47. The emitter electrode to the transistor 101 is connected to a bias level voltage such as −5.2 V by a resistor 102.

Referring more specifically to the unlatch driver network, the emitter electrodes of the dual input transistors 103a and 103b are connected to the collector electrodes of the transistors 100a and 100b, respectively. The base electrodes of the transistors 103a and 103b are connected to ground potential. The collector electrode of the transistor 103 is connected to the cathode electrode of a Schottky diode 106 through a resistor 104. The collector electrode of the transistor 103b is connected to the cathode electrode of the diode 106 through a resistor 105. The anode electrode of a diode 106 is connected to the emitter electrode of a transistor 107 and to an output terminal which provides a bias voltage $D_2$ of approximately 3.4 volts. The collector and base electrodes of the transistor 107 are connected together and to the emitter electrode of a transistor 108. The emitter electrode of the transistor 108 is also connected to an output terminal which provides a bias voltage $D_1$ of approximately 4.2 volts. The collector and base electrodes of the transistor 108 are connected together and to a bias voltage such as +5 V.

The collector electrode of the transistor 103a is connected to the base electrode of a dual emitter transistor 109. The collector electrode of the transistor 109 is connected to +5 V. The first and second emitter electrodes of the transistor 109 are connected to ground potential through pull-down resistors 110 and 111, respectively. The first and second emitters of the transistor 109 are also connected to output terminals which provide the unlatch signal to the latch networks.

The collector electrode of the transistor 103b is connected to the base electrode of a dual emitter transistor 112. The collector electrode of the transistor 112 is connected to +5 V. The first and second emitter electrodes of the transistor 112 are connected to ground potential through pull-down resistors 113 and 114, respectively. The first and second emitter electrodes of the transistor 112 are also connected to a second set of output terminals which provide the unlatch clock signals to thee latch networks.

The operation of the buffer network 35 and the unlatch clock network 37, according to FIG. 6, are now described with reference to that figure.

The transistor 101 generates a switched current which passes through either the transistors 100a or 100b depending on the input signals applied to the transistors by a signal source 36. A signal applied to the base electrode of the transistor 100a causes the switch current to flow through that transistor. If a signal is applied to the transistor 100b, the current would flow in that transistor.

The function of the ULC buffer 35 and the unlatch driver network 37 is to receive the ULC signals from an external source 36 at standard ECL circuit levels; i.e. −0.82 to −1.7 volts, and to translate the signals to the proper levels and provide the required impedance for driving the latch networks in the first level decoding network 12.

As the switch current is switched between transistors 100a and 100b, the current is switched between transistors 103a and 103b, respectively. The current flow through the transistor 103 causes a voltage drop across the resistor 104 which in turn controls the output signal $\overline{LT}$ from the transistor 109. Thus, if the switch current flows through the transistor 103a, the output level of the transistor 109 will be below the output level of the transistor 112. Conversely, if the switch current flows through the transistor 103b, the transistor 112 will provide an output signal LT 1 and LT 2 which is lower than the output signal of the transistor 109. The transistors 109 and 112 are emitter-followers which provide the required circuit isolation for maintaining a high operating speed while driving the latch networks, which are a capacitive load.

The transistor 108 provides a bias voltage which is one diode drop below the +5 volts. The transistor 107 provides a bias voltage which is two diode drops below the +5 V bias voltage.

The voltage level of the output signal LT 1, LT 2, $\overline{\text{LT 1}}$, and $\overline{\text{LT 2}}$ are approximately 2.1 volts in the high state and 1.8 volts in the low state.

Thus, it is seen that a logic 1 input signal to the transistors 100a results in a logic 1 output signal from the transistor 112 which is level shifted with respect to the voltage level of the signal ULC. Similarly, logic 0 signal to the transistor 100b results in a logic 0 output signal from the transistor 109 which is level shifted with respect to $\overline{\text{ULC}}$ signal.

Figure 7:
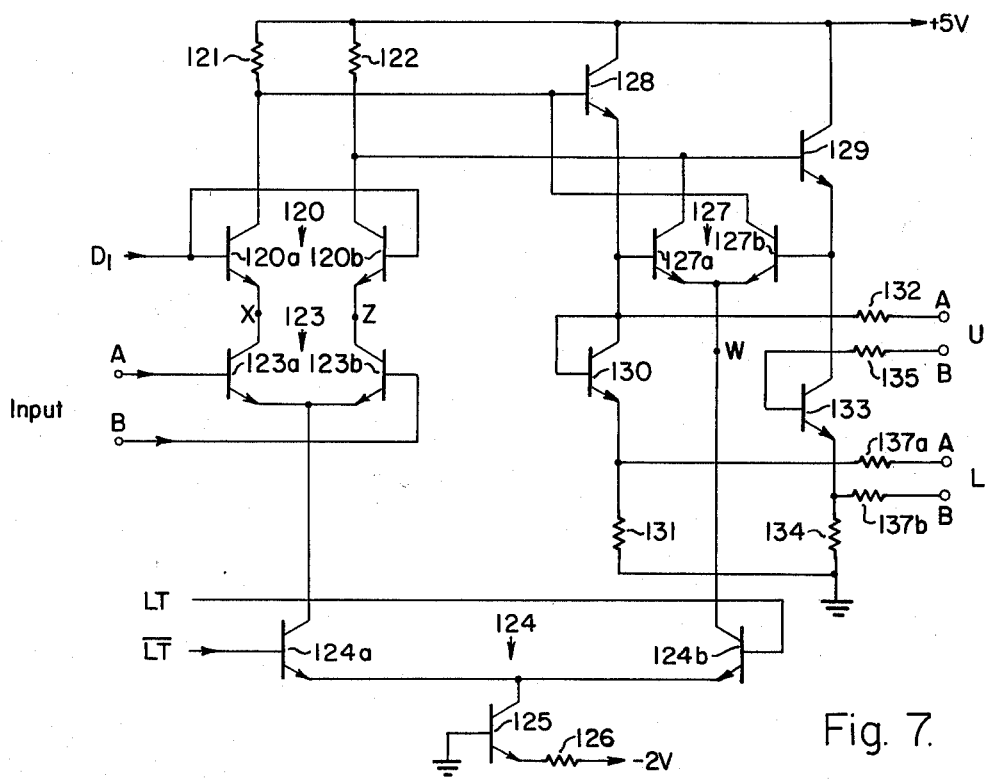
FIG. 7 is a schematic circuit diagram illustrating a single input differential latch circuit utilized to generate the most significant bit (MSB) of a 4-bit quantizer according to FIG. 1.

Referring now to FIG. 7, a latch network 33 is now described. A cascode isolation stage 120 includes first and second base coupled transistors 120a and 120b which are connected to a bias voltage $D_1$ of approximately 4.2 volts. The collector of the transistor 120a is connected to +5 V through a load resistor 121. The collector electrode of the transistor 120b is connected to +5 V through a load resistor 122. The emitter electrodes of the transistors 120a and 120b are connected to the collector electrodes of a dual differential current switch stage 123. The differential current switch stage 123 includes first and second transistors 123a and 123b having their emitter electrodes connected together and to the first collector electrode of a differential current switch 124. The base electrode of the transistor 123b is connected to a first input terminal, labeled A. The base electrode of the transistor 123a is connected to a second input electrode, labeled B.

The differential current switch 124 includes first and second transistors 124a and 124b which are connected together at their emitter electrodes. The emitter electrodes are in turn connected to a current source illustrated here as a transistor 125. The emitter electrode of the transistor 125 is connected to a bias voltage such as −2 V through a resistor 126. The base electrode of the transistor 125 is connected to ground potential. The base electrodes of the transistors 124a and 124b receive the latch timing signals from the unlatch driver network. The transistor 124b receives the signal identified as LT while the transistor 124a receives the signal $\overline{\text{LT}}$. The differential current switch 124 switches the current between the transistors 124a and 124b in response to the timing signals.

The latch network 33 further includes a differential regenerative current switch 127 which includes first and second transistors 127a and 127b having their emitter electrodes connected together and to the collector electrode of the transistor 124b. The collector electrode of the transistor 127a is connected to the bias voltage of +5 V through the resistor 122. The collector electrode of the transistor 127b is connected to +5 V through the resistor 121. The base electrode of the transistor 127a is connected to the emitter electrode of an output emitter follower 128. The base electrode of the transistor 127b is connected to the emitter electrode of a second emitter follower 129.

The base and collector electrodes of the transistor 128 are connected across the bias resistor 121, and the collector electrodes are connected to +5 V. The base and collector electrodes of the emitter follower 129 are connected across the bias resistor 122, and the collector electrode is connected to +5 V.

The base electrode of the transistor 127a is connected to the collector electrode of a diode-connected transistor 130 which provides a level shifting function. The emitter electrode of the transistor 130 is connected to ground potential through a bias or pull down resistor 131. The collector electrode of the transistor 130 is also connected to the first output terminal, labeled A, of a pair of upper level output terminals, labeled U. The emitter electrode of the diode connected transistor 130 is connected, through isolation resistor 137a, to the first terminal, labeled A, of a pair of output terminals. The output terminals provide a lower level output signal, labeled L. The emitter electrode of the transistor 130 is also connected to ground potential through a pull-down resistor 131. The collector electrode of a second diode connected level-shifting transistor 133 is connected to the base electrode of the transistor 127b. The collector electrode of the transistor 133 is also connected to a second output terminal, labeled B, of a pair of upper level output terminals through a resistor 135. The emitter electrode of the transistor 132 is connected to ground potential through a pull-down resistor 134. The emitter electrode of the transistor 133 is also connected to a second output terminal, labeled B, of a pair of lower level output terminals through an output resistor 137b.

The operation of the latch network 33, according to FIG. 7, is now described.

The current generated by current source transistor 125 and resistor 126 is applied to the junction of the emitters of the differential current switch formed by transistors 124a and 124b. When the $\overline{\text{LT}}$ signal is in a "1" or high state, transistor 124a directs the current through to the emitter junctions of the differential input amplifier formed by transistors 123a and 123b. Thus the differential amplifier is activated. The differential output current of transistors 123a and 123b is proportional to the difference in their input voltages to terminals A & B. The differential output voltage is applied to the emitter electrodes of the cascode isolation transistors 120a and 120b through nodes X and Z, respectively. It should be noted that nodes X and Z are the differential current input nodes for all of the basic latch configurations. The differential input current passes through transistors 120a and 120b and is applied to resistors 121 and 122 where it is converted back to a differential voltage. In this mode of operation, the latch provides an output signal that tracks the differential state of the input. The output signal is generated by the output emitter follower transistors 128 and 129. Transistors 128 and 129 provide impedance conversion (from high to low) and a level shift function. Two output common mode voltage bands are provided. The first output signal is provided via isolation resistors 132 and 135 directly from the emitter electrodes of transistors 128 and 129. The second output signal is level shifted by one diode drop voltage by diodeconnected transistors 130 and 133 and provided via isolation resistors 137a and 137b.

Latching function is obtained by reversing the polarity of the LT and $\overline{\text{LT}}$ inputs causing $\overline{\text{LT}}$ to be in the high or "1" state. In this condition the current generated by transistor 125 is directed to the emitter electrode of the differential amplifiers formed by transistors 127a and 127b. The input and output signals of the differential amplifier 127 are applied to transistors 128 and 129 causing a positive feedback condition to arise. The output signals are bi-stable, i.e., stable in only the "1" or "0" output logic states from the differential amplifier 127 when the bias current is switched through one transistor or the other. If an input signal is applied near the mid or balance point of the differential amplifier transfer function, an exponential regeneration will occur until the signal has finally latched to the "1" or "0" states. The time constant of the regenerative exponential response is called the regeneration time constant. Regeneration is the process by which the analog input signals are actively "quantized" into discrete digital output codes. The differential regeneration current switch transistors 127a and 127b control the same net current as the output stage and thus the same output signal levels occur in the latching mode.

Referring now to the latch networks of FIGS. 7a, 8, 9 and 10, like components having the same or similar functions in the circuits of the above-identified figures will have the same component reference designations as the elements of FIG. 7.

Figure 8:
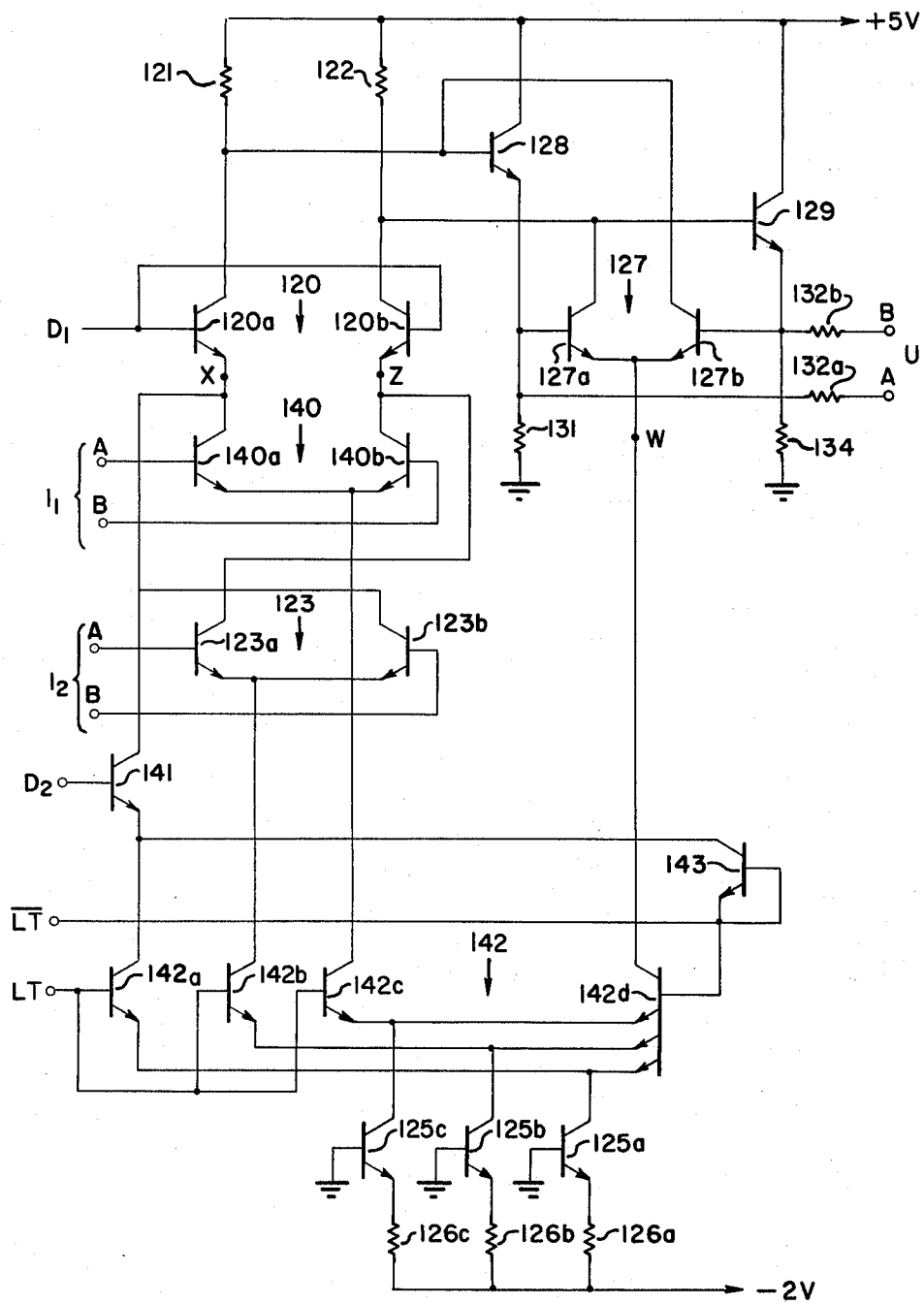
FIG. 8 is a schematic circuit diagram of a dual input single output differential latch circuits 31a–31d according to FIG. 1.

Referring more specifically to FIG. 8, the circuit of the latch network 31a is now described in detail. A cascode isolation stage 120 includes first and second transistors 120a and 120b having their base electrodes connected together and to a bias voltage $D_1$ of approximately 4.2 volts. The collector electrodes of the transistors 120a and 120b are connected to the bias voltage of +5 V through load resistors 121 and 122 respectively. The emitter electrodes of the transistors 120a and 120b are connected to the collector electrodes of transistors 123b and 123a, respectively, which provide a differential current switch function. The emitter electrodes of the transistors 120a and 120b are also connected to the collector electrodes of first and second transistors 140a and 140b which provide a second differential current switch function. The base electrodes of the transistors 140a and 140b are connected to input terminals A and B respectively which receive a first control signal labeled $I_1$.

The emitter electrode of the transistor 120a is also connected to the collector electrode of a delay matching transistor 141. The base electrode of the transistor 141 is connected to a bias voltage and the emitter electrode is connected to the collector electrode of a transistor 142a which is a first transistor of the differential current switch 142. The emitter electrodes of the differential current switch transistors 123a and 123b are connected together and to the collector electrode of a second differential current switch transistor 142b. The emitter electrodes of the second differential current switch transistors 140a and 140b are connected together and to the collector electrode of a third transistor 142c of third differential current switch 142.

The base electrodes of the differential transistors 123a and 123b are connected to input terminals, labeled A and B, respectively, and receive a second input signal labeled $I_2$.

The base electrodes of the transistors 142a, b and c are connected together and to a control terminal labeled LT. The emitter electrode of the transistor 142a is connected to the first emitter electrode of a triple emitter electrode transistor 142d. The emitter electrodes of transistors 142b and 142c are connected to the second and third emitter electrodes of the transistor 142d. The first emitter electrode of the transistor 142d is connected to the collector electrode of a current source transistor 125a. The second and third emitter electrodes of the transistor 142d are connected to the collector electrodes of second and third current source transistors 125b and 125c, respectively. The emitter electrodes of the current source transistors 125a–125c are connected to −2 V through bias resistors 126a, 126b and 126c, respectively. The base electrodes of the transistors 125a–125c are connected to ground potential.

The differential regenerative current switch 127 includes transistors 127a and 127b having their emitter electrodes connected together and to the collector electrode of the transistor 142d. The collector electrodes of the transistors 127a and 127b are connected to +5 V through load resistors 122 and 121, respectively.

The collector electrode of an output emitter follower 128 is connected to +5 V while the base electrode is connected to +5 V through the load resistor 121. The emitter electrode of the transistor 128 is connected to the base electrode of the transistor 127a and to ground potential through a resistor 131. The emitter electrode of the transistor 128 is further connected to a first output terminal, labeled A, of a pair of output terminals, through a resistor 132a. The collector electrode of a second output emitter follower transistor 129 is connected to a +5 V and the base electrode is connected to +5 V through the resistor 122. The emitter electrode of the transistor 129 is connected to the base electrode of the transistor 127b and to ground potential through a resistor 134. The emitter electrode of the transistor 129 is also connected to a second output terminal, labeled B.

The base electrode of the transistor 142d is connected to the base and emitter electrodes of a capacitance compensation transistor 143. The base electrode of the transistor 142d is further connected to a second control electrode labeled LT. The collector electrode of the transistor 143 is connected to the emitter electrode of the delay matching transistor 141.

Figure 7A:
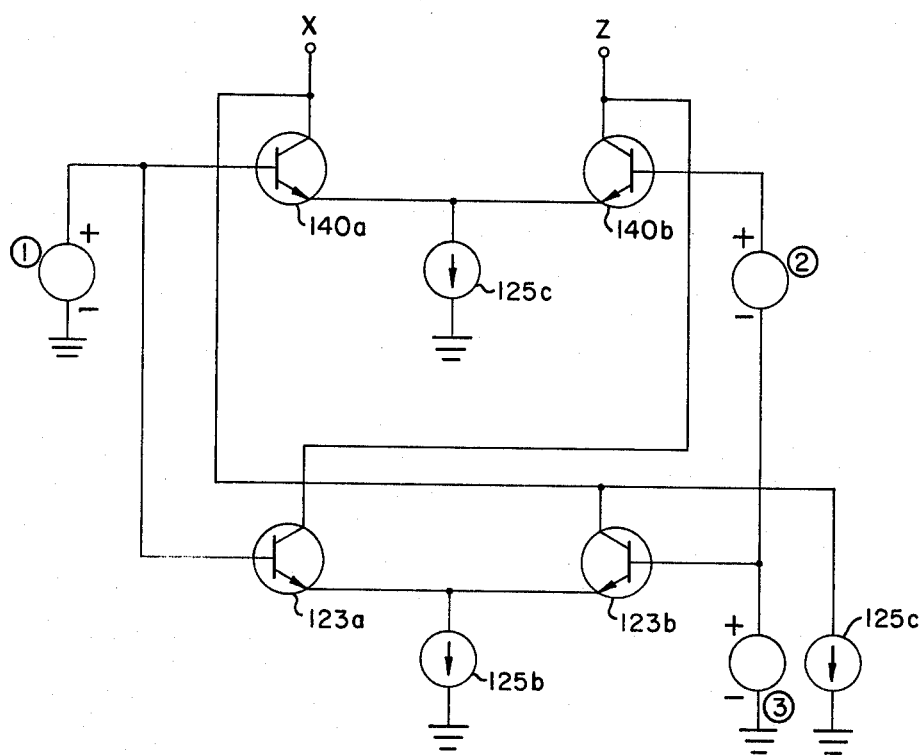
FIG. 7a is a schematic circuit diagram illustrating the dual input network of dual differential latch circuits.

The operation of the latch network according to FIG. 8 is now described with reference to that figure and with reference to FIG. 7a.

The voltage source 1, circled numeral, represents one input voltage to transistors 140a and 123a. Transistors 140a and 140b form one differential amplifier, and transistors 123a and 123b form another differential amplifier. The transistor 125c applies current to the emitter node of the differential amplifier formed by transistors 140a and 140b. The transistor 125b supplies the bias current to the emitter node of the transistors 123a and 123b. Voltage source 3, circled numeral, a reference level voltage, is connected between ground potential and the base electrode of transistor 123b. The voltage source 2, circled numeral, represents the second input voltage having its positive and negative terminals connected between the base electrode of transistor 140b and the base of electrode 123b. The third current source, current source 125a, is connected to the collector of transistor 123b and the collector of transistor 140a, as well as node X. Node Z is connected to the collector of transistor 140b and the collector of transistor 123a. The figure also shows a truth table that shows the current levels at nodes X and Z as a function of the relationship of voltage 1 to voltage 3 and voltage 2. By setting current sources 125c, 125b, and 125a equal to a nominal current of $I_0$, it can be seen from the truth table that as voltage 1 is changed from less than voltage 3 to greater than the sum of voltages 2 and 3, that the output current differentially switches from an initial zero state. In the initial state, the output current X is $I_0$ and the output current Z is $2 \times I_0$. In the "1" state the output current X is $2 \times I_0$ and the current at node Z is $I_0$. The first change of state occurs as the threshold is exceeded where voltage 1 is equal to voltage 3. As a second threshold is exceeded, where voltage 1 is equal to voltage 2+3, the output differential current switches back to the original "0" state and the current at node X is $I_0$, the current at node Z is $2I_0$. This differential current swing occurs about a common mode current level that is $3/2I_o$.

In this circuit the cascode isolation transistors 120a and 120b, resistors 121 and 122, output emitter-followers transistors 128 and 129, and regenerative differential amplifier transistors 127a and 127b behave exactly the same as in their respective counterparts in the single input latch network 33. The emitter of transistor 120a can be referred to as node X and the emitter of transistor 120b can be referred to as node Z. The emitter junctions of transistors 127a and 127b which are connected together can be referred to as node W. The circuitry in both these latch configurations (i.e., below nodes X and Z and W) can be interchanged. The single input latch can be converted to a dual input latch by taking the circuitry shown here in the schematic of the latch network 31a and substitute for the circuitry shown below nodes X, Z and W in the circuit of the latch network 33. An additional difference between the latches 31 and 33 is that only one single output is used, and there is no provision for level shifting. The output level shift differences have no effect on the fundamental operation of the circuitry except so as to allow or provide for the different level outputs as required for the following logic networks which are connected to those outputs.

Referring again to FIG. 8, transistors 125a, 125b and 125c and resistors 126a, 126b and 126c form three identical matched current sources that have an output current set by the $-2$ V supply whose value is $I_0$. Transistor 142d sums the three switch currents into a single collector structure which is attached to node W or the emitter nodes of transistors 127a and 127b. When the LT signal is in the "1" or high state, transistors 142a, 142b and 142c are conducting and each in turn directs a current $I_0$ to the emitter node of the preceding circuitry. Thus, the transistor 142d is completely cut off and no current is supplied into the regenerating latching differential amplifier. Transistor 143 is used to null out or minimize the coupling of the switching voltage transients that occur due to the collector base junction capacitance of transistor 142a. This is accomplished as the $\overline{LT}$ input signal is rising and the LT input signal is falling and because of their similarities of delays in rise time, the net current through the two collector-base junction capacitances of transistor 142a, transistor 143 essentially null out at the emitter node of transistor 141. This eliminates one source of offset that can occur in this latch configuration. Transistor 141 functions as a switch current source $I_O$ similar to the current source 125c in FIG. 7. The upper and lower differential amplifiers of FIGS. 7 and 8 function similarly. The latch 31a produces a differential current output whose differential current swings is $I_O$ around a common mode current offset of $3/2\ I_0$.

Figure 9:
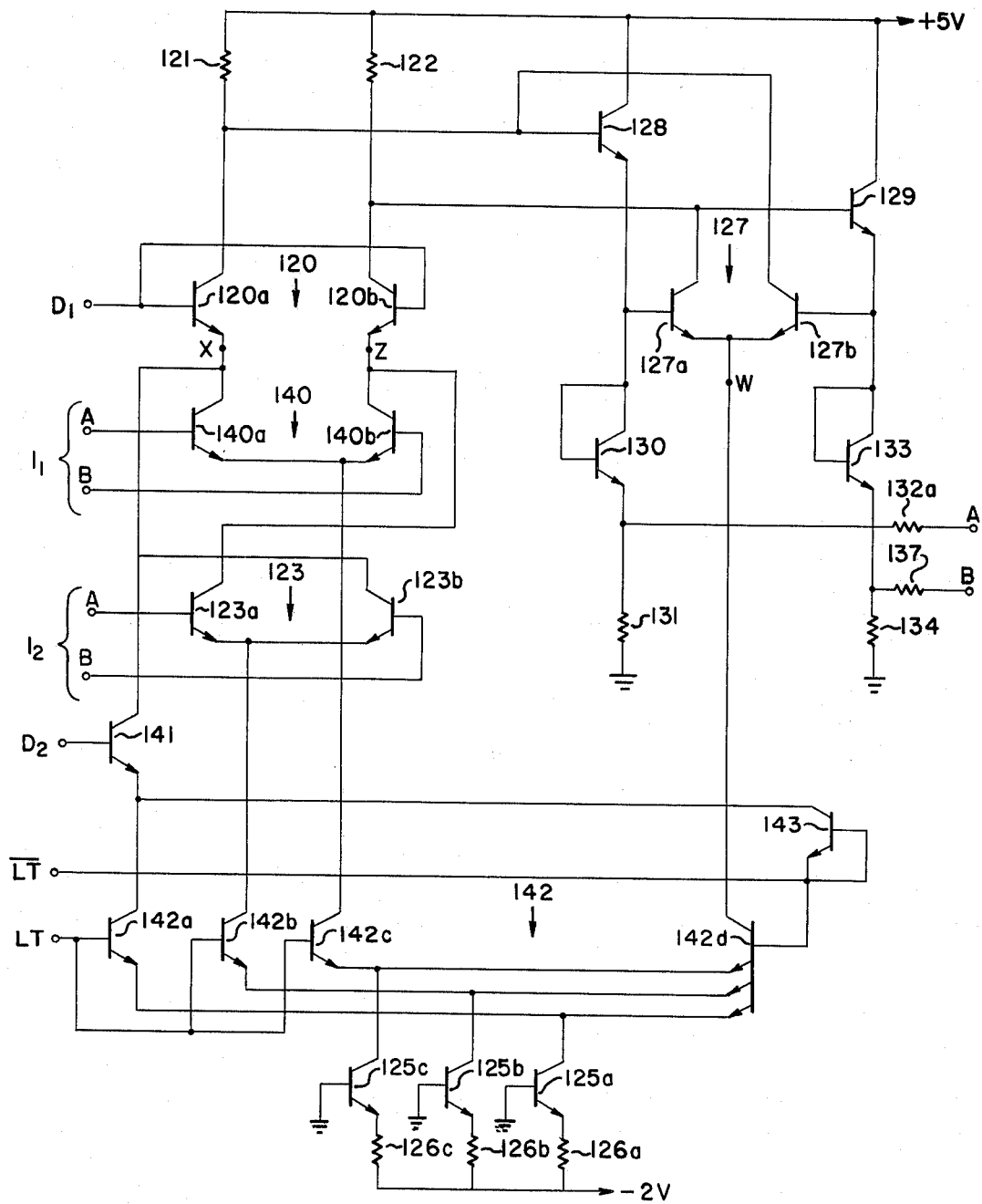
FIG. 9 is a schematic circuit diagram of a dual input dual output differential latch circuits 32a–32c according to FIG. 1.

Referring more specifically to FIG. 9, a latch network 32a is now described in greater detail. The schematic circuit of the latch network 32a is similar to the circuit of the latch network 31a with additional level shifting output being provided in the circuit according to FIG. 9. Therefore, only the additional level shifting components will be discussed in detail. The base electrode of the differential current regeneration switch 127a is connected to the collector electrode of a diode connected transistor 130. The emitter electrode of the transistor 130 is connected to ground potential through a resistor 131. The emitter electrode of the transistor 130 is also connected through a resistor 132a to a first output terminal, labeled A, of a pair of differential output terminals. The diode connected transistor 130 provides a level shift that is required by the logic networks to which the latch network 32a is connected.

The base electrode of the transistor 127b is connected to the collector electrode of a diode connected transistor 133. The emitter electrode of the transistor 133 is connected to ground potential through a resistor 134 and to a second output terminal, labeled B, through a resistor 137.

The operation of the circuit according to FIG. 9 is identical to that of the operation of the circuit of FIG. 8 and therefore will not be further discussed in detail.

Figure 10:
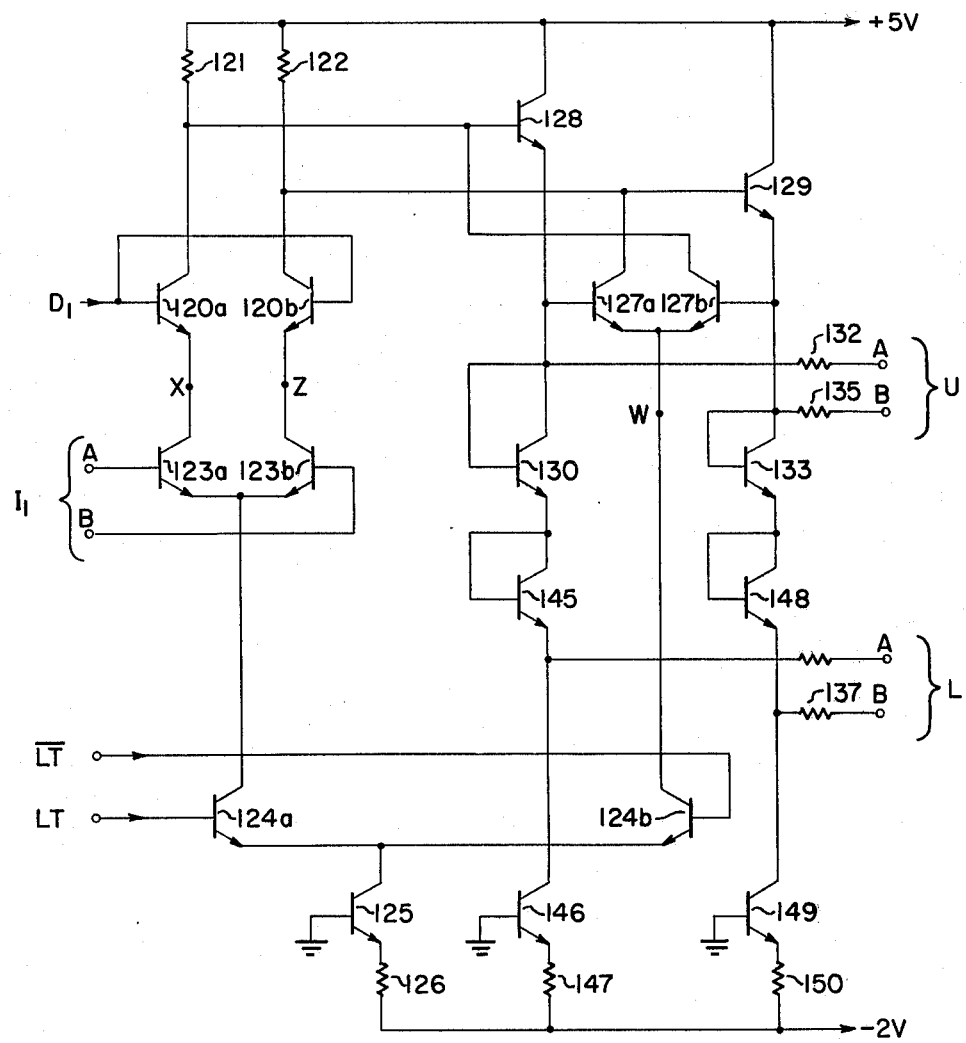
FIG. 10 is a schematic circuit diagram illustrating a single input-dual output differential latch circuit 30 for generating the position bit according to FIG. 1.

Referring more specifically to FIG. 10, a latch network 30 is now described in detail. The latch 30 is similar to the latch network 33 except for some additional circuitry which will be discussed in detail.

The emitter electrode of a diode connected transistor 130 is connected to the collector electrode of a third diode connected transistor 145 for providing a level shift. The emitter electrode of the transistor 145 is connected to the collector electrode of an output pull-down current source illustrated here as a transistor 146. The emitter electrode of the transistor 146 is connected to a $-2$ volts bias voltage through a bias resistor 147. The base electrode of the transistor 146 is connected to ground potential. The emitter electrode of the transistor 145 is connected to a first output terminal, labeled A, of a pair of differential output terminals labeled L.

The emitter electrode of a second diode-connected transistor 133 is connected to a collector electrode of a fourth diode-connected transistor 148. The emitter electrode of the transistor 148 is connected to the collector electrode of a second output pull-down current source illustrated here as a transistor 149. The emitter electrode of the transistor 149 is connected to $-2$ volts through a bias resistor 150. The base electrode of the current source 149 is connected to ground potential.

The collector electrode of the differential current switching transistor 124b is connected to a second differential output terminal labeled B through a resistor 137.

The operation of the latch network according to FIG. 10 is similar to the operation of the latch networks of FIGS. 7, 7c and 8 and will therefore not be described in detail.

Figure 11:
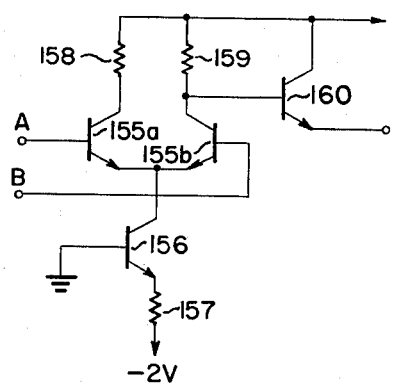
FIG. 11 is a schematic circuit diagram of a delay logic network according to FIG. 1.

Referring more specifically to FIG. 11, a delay gate 40 is now described. Differential current switching transistors 155a and 155b are connected together at their respective emitter electrodes and connected to the collector electrode of a current source illustrated here as a transistor 156. The emitter electrode of the transistor 156 is connected to a bias voltage such as $-2$ volts through a resistor 157 and the base electrode is connected to ground potential. The collector electrodes of the transistors 156a and 156b are connected to $+5$ V through respective resistors 158 and 159. The resistor 158 is a balance resistor for matching power dissipations in the transistors 155a and 155b. The base electrodes of the transistors 156a and 156b are connected to first and second differential input terminals, labeled A and B. The collector electrode of the transistor 156b is connected to the base electrode of an emitter follower transistor 160. The collector electrode of the transistor 160 is connected to +5 volts and the emitter electrode is connected to an output terminal.

The operation of a circuit, according to FIG. 11, is now described with reference to that figure.

The delay gate 40 performs no logic function, but merely provides a time-delay which matches the propagation delays of the other logic networks in the second level decode network 13. The differential input is applied to the pair of differential transistors 155a and 155b. If the input signal to the transistor 155a is more positive than the input to the transistor 155b, no current will flow through the transistor 155b and there is a 0 voltage drop across the resistor 159. The transistor 160 in response provides a logic 1 output signal. Conversely, if the input signal to the transistor 155b is more positive, current flow will flow through the resistor 159 resulting in a voltage drop thereacross. The transistor 160 will then provide a logic 0 output signal.

Figure 12:
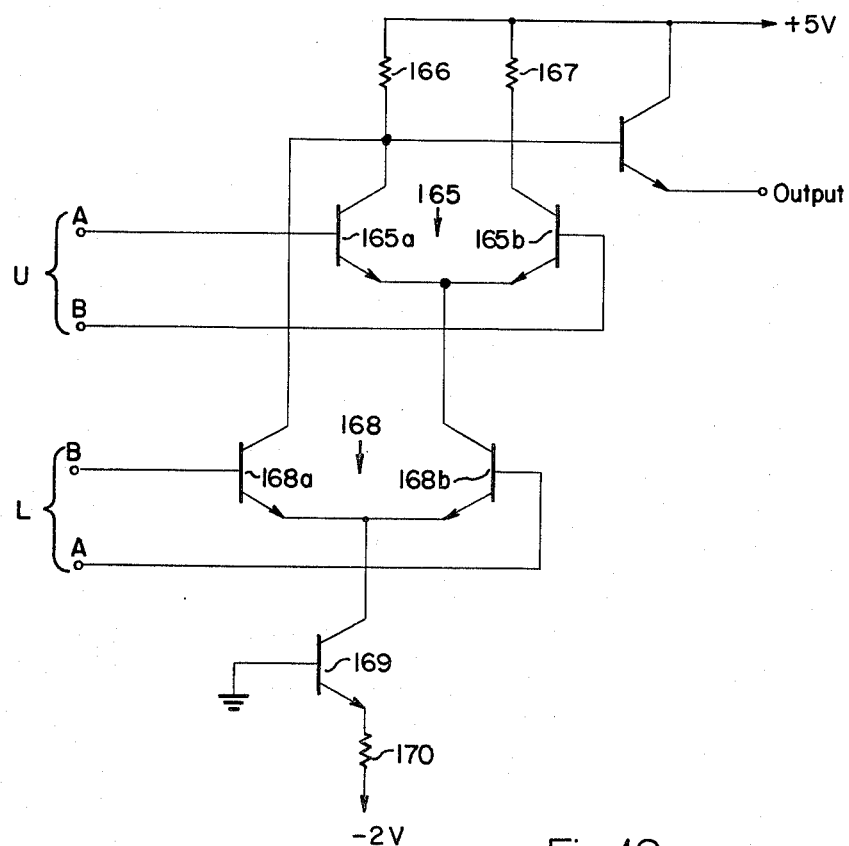
FIG. 12 is a schematic circuit diagram illustrating an AND logic gate 41 used to generate the MSB by "ANDing" the output signals of latch circuits 30 and 33 according to FIG. 1 and Table I.

Referring more specifically to FIG. 12, an AND gate 41 is now described in detail. An upper level differential current switch 165 includes first and second transistors 165a and 165b, respectively, having their emitter electrodes connected together. The base electrodes of the transistors 165a and 165b are connected to positive and negative input terminals of an upper level input differential pair, labeled U. The collector electrodes of the transistors 165a and 165b are connected to +5 volts through resistors 166 and 167.

A lower level differential current switch 168 includes first and second transistors 168a and 168b, respectively, having their emitter electrodes connected together. The base electrodes of the transistors 168a and 168b are connected to negative and positive lower level input terminals, respectively, labeled L. The collector electrode of the transistor 168a is coupled to +5 volts through the resistor 166. The collector electrode of the second differential transistor 168b is connected to the emitter electrodes of the transistors 165a and 165b. The emitter electrodes of the transistors 168a and 168b are connected to the collector electrode of a current source transistor 169. The emitter electrode of transistor 169 is connected to −2 volts through a bias resistor 170 and the base electrode is connected to ground potential.

An output emitter follower 171 has its base electrode connected to +5 V through the resistor 166 and the collector electrode is connected directly to +5 V. The emitter electrode of the transistor 171 is connected to an output terminal.

The operation of the circuit according to FIG. 12 is now described with reference to that figure.

The AND gate 41 generates the MSB ($2^3$) output bit of the four-bit quantizer according to the present invention by combining the output signals of the latch networks 30 and 33 according to the logic equation ($33L \cdot \overline{30U}$). The transistor 169 generates the switch current which is directed through the cascode logic tree consisting of transistors 168a, 168b, 165a and 165b. A true signal applied to the positive sign input terminal causes the transistor 168b to conduct current and transistor 168a is turned off. Current also flows through either the transistor 165a or the transistor 165b depending on the input signals thereto. A logic 1 signal applied to the transistor 165b and a logic 0 applied to the transistor 165a causes the transistor 165b to conduct current through resistor 167. The result is that transistor 165a is turned off which corresponds to a logic 1 output signal from transistor 171. If, however, a logic 1 signal is applied to the transistor 165a and a logic 0 is applied to the transistor 165b, current will flow through the transistor 165a resulting in a voltage drop across the resistor 166 resulting in a logic 0 output from transistor 171.

A logic 1 signal to the transistor 168a and a logic 0 input to the transistor 168b causes transistor 168a to conduct current through the resistor 166 which is defined as a logic 0 output state. Thus, whenever a current flows through the transistors 165a or 168a, transistor 171 will provide a logic 0 output state.

Figure 13:
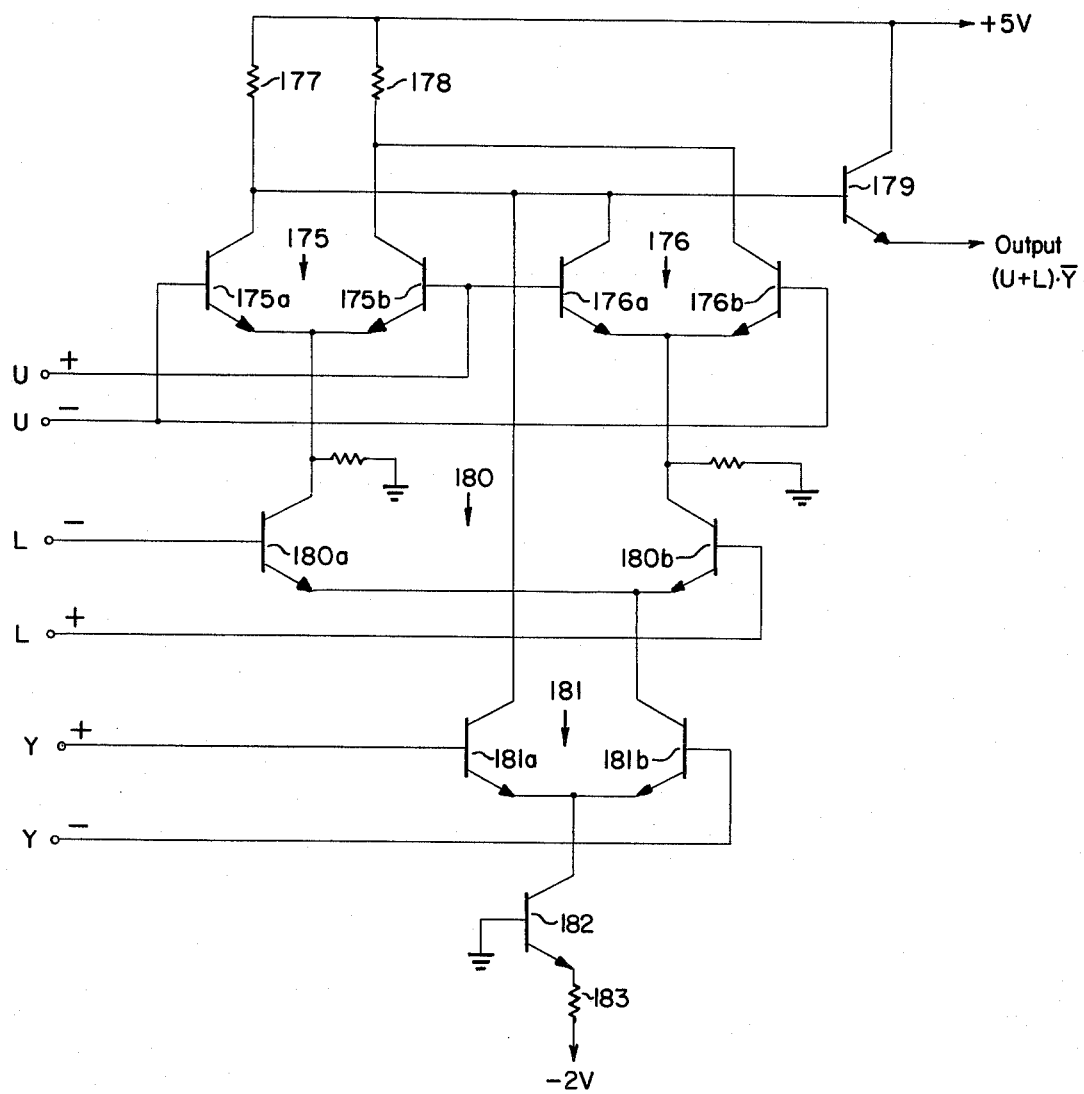
FIG. 13 is a schematic circuit diagram illustrating Y logic gates 42a–42c having triple differential input terminals responding to the output signals of selected latch circuits.

Referring more specifically to FIG. 13, a Y gate 42a is now described in detail. A first upper level differential current switch 175 includes first and second transistors 175a and 175b, respectively, having their emitter electrodes connected together. A second upper level differential current switch 176 includes first and second transistors 176a and 176b, respectively, having their emitter electrodes connected together. The collector electrodes of the transistors 175a and 176a are connected to +5 V through a resistor 177. The collector electrodes of the transistors 175b and 176b are connected to +5 volts through a bias resistor 178.

An output emitter follower 179 has its base electrode connected to the collector electrodes of the transistors 175a and 176a. The collector electrode of the transistor 179 is connected to +5 volts and the emitter electrode is connected to an output terminal.

Referring again to the upper level differential current switches 175 and 176, the base electrodes of the transistors 175b and 176a are connected together and to a positive input terminal of an upper level differential input terminal pair, labeled U. The base electrodes of the transistors 175a and 176b are connected together and to the negative input terminal of the upper level input terminal pair.

A lower level differential current switch 180 includes first and second transistors 180a and 180b, respectively, having their emitter electrodes connected together. The collector electrode of the transistor 180a is connected to the emitter electrodes of the transistors 175a and 175b. The collector electrode of the transistor 180b is connected to the emitter electrodes of the transistors 176a and 176b. The base electrode of the transistor 180b is connected to the positive input terminal of lower level input terminals, labeled L. The base electrode of the transistor 180a is connected to the negative terminal of the lower level input terminals.

A Y level differential current switch 181 includes first and second transistors 181a and 181b, respectively, having their emitter electrodes connected together. The collector electrode of the transistor 181a is connected to the base electrode of the emitter follower 179. The collector electrode of the transistor 181b is connected to the emitter electrodes of the lower level differential current switch 180. The base electrode of the transistor 181a is connected to the positive terminal of a pair of Y level input terminals. The base electrode of the transistor 181b is connected to the negative input terminal of the Y level input terminal.

The emitter electrodes of the transistor 181a and 181b are connected to the collector electrode of a current source transistor 182.

The emitter electrode of the transistor 182 is connected to −2 volts through a bias resistor 183, and the base electrode is connected to ground potential.

The operation of the Y gate, according to FIG. 13, is now described with reference to that figure.

The Y gate 42a is a three level cascode circuit in the current switch emitter follower family of logic circuits. The gate 42a performs the following logic function $(U \oplus L) \cdot \overline{Y}$. A logic 1 signal applied to the transistor 181a and a logic 0 applied to the transistor 181b results in the current source transistor 182 providing current through the resistor 177. The voltage drop across the resistor 177 results in a logic 0 output signal from the transistor 179.

If a logic 1 signal is applied to the transistor 171b and a logic 0 applied to the transistor 171a, the current source 182 will conduct current through the transistor 181b and the transistor 181a will be turned off. The current flow will then be through either transistor 180a or transistor 180b depending upon the input signals thereto. A logic 1 input signal to the transistor 180b and logic 0 input to the transistor 180a causes the transistor 180b to conduct current through either transistor 176a or 176b. If a logic 1 signal is applied to the transistor 176b, that transistor will conduct current through the resistor 178 which results in a logic 1 output signal from the transistor 179. If, however, a logic 0 signal is applied to the transistor 176b, current will flow through the transistor 176a resulting in a voltage drop across the resistor 177 and a logic 0 output signal.

The operation of the upper level differential current switches in the middle level differential current switches is that of a classic EXCLUSIVE-OR gate and therefore will not be described in greater detail.

Figure 14:
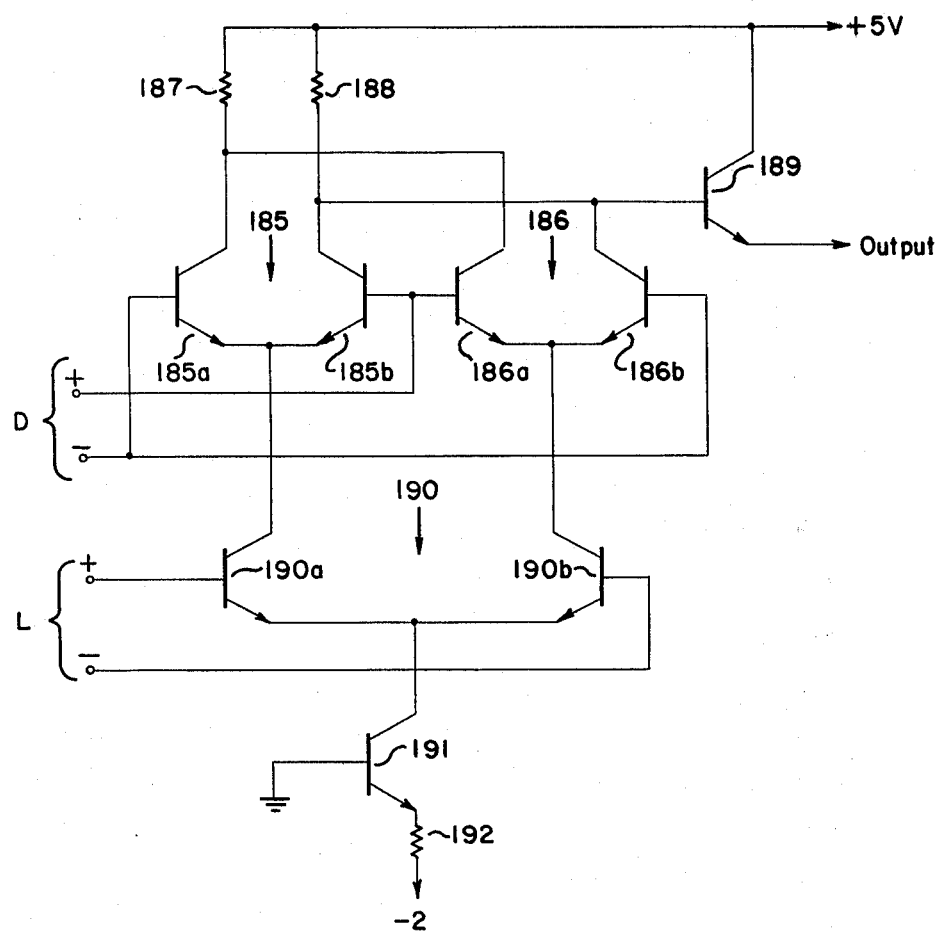
FIG. 14 is a schematic circuit diagram illustrating an EXCLUSIVE-OR logic gates 42a–43d.

Referring more specifically to FIG. 14, an exclusive-OR logic gate is now described. A first upper level differential current switch 185 include first and second transistors 185a and 185b, respectively, having their emitter electrodes connected together. The second upper level differential current switch 186 includes first and second transistors 186a and 186b and their emitter electrodes are coupled together. The collector electrodes of the transistors 185a and 186a are connected to +5 volts through a bias resistor 187. The collector electrodes of the transistors 185b and 186b are connected to +5 volts through a bias resistor 188.

An output emitter follower transistor 189 has its base electrode connected to +5 volts through the resistor 188. The collector electrode of the transistor 189 is connected to +5 volts and the emitter electrode is connected to an output terminal.

The base electrodes of the transistors 185b and 186a are connected together and to a positive input terminal of an upper level input terminal pair labeled U. The base electrodes of the transistors 185a and 186b are connected together and to the negative input terminal of the upper level input terminal pair.

A lower level differential input switch 190 includes first and second transistors 190a and 190b having their emitter electrodes connected together. The collector electrode of the transistor 190a is connected to the emitter electrodes of the first upper level differential current switch 185. The collector electrode of the transistor 190b is connected to the emitter electrodes of the second upper level differential switch 186. The base electrode of the transistor 190a is connected to the positive input terminal of a lower level differential input terminal pair. The base electrode of the transistor 190b is connected to the negative input terminal of the lower level input pair.

A current source illustrated here as a transistor 191 has its collector electrode connected to the emitter electrodes of the lower level differential current switch 190. The emitter electrode of the transistor 191 is connected to −2 volts through a bias resistor 192 and the base electrode is connected to ground potential.

The operation of an exclusive-OR logic gate according to FIG. 14 is now described with reference to that figure.

The EXCLUSIVE-OR logic gate 43a is a two-level cascode circuit of the current switch emitter follower family of logic circuitry. The first level is a differential current switch emitter follower consisting of transistors 190a and 190b. A logic 1 input signal to the transistor 190a turns that transistor on and turns the transistor 190b off. The current source 191 then causes current to flow through the transistor 190a and through either of the two upper level transistors 185a or 185b depending upon the input signals thereto. A logic 1 signal to the transistor 185a turns that transistor on and turns the transistor 185b off. Thus, current flows through the resistor 187 and the output emitter follower 189 provides a logic 1 output state. If, however, a logic 1 signal is applied to the transistor 185b, that transistor is on and transistor 185a is turned off. Current thence flows through the resistor 188 causing a voltage drop thereacross and the transistor 189 provides a 0 output state. Thus, if logic 1 input signals are applied to both the transistor 190a and the transistor 185b, the output signal is a logic 0.

If a logic 1 signal is applied to the transistor 190b and a logic 0 signal is applied to the transistor 190a, that transistor is turned off and the transistor 190b conducts current through the transistor 191. If there is a logic 1 signal applied to the transistor 186a and a logic 0 signal applied to the transistor 186b, the transistor 186a conducts current through the resistor 187 and the emitter follower 189 provides a logic 1 output state. If, however, a logic 1 signal is applied to the transistor 186b and a logic 0 signal applied to the transistor 186a, the transistor 186b will conduct current through the transistor 188 and the emitter follower 189 will provide a logic 0 output signal. Thus again it is seen if the same signals are applied to the U and the L terminals, the output is a logic 0.

Figure 15:
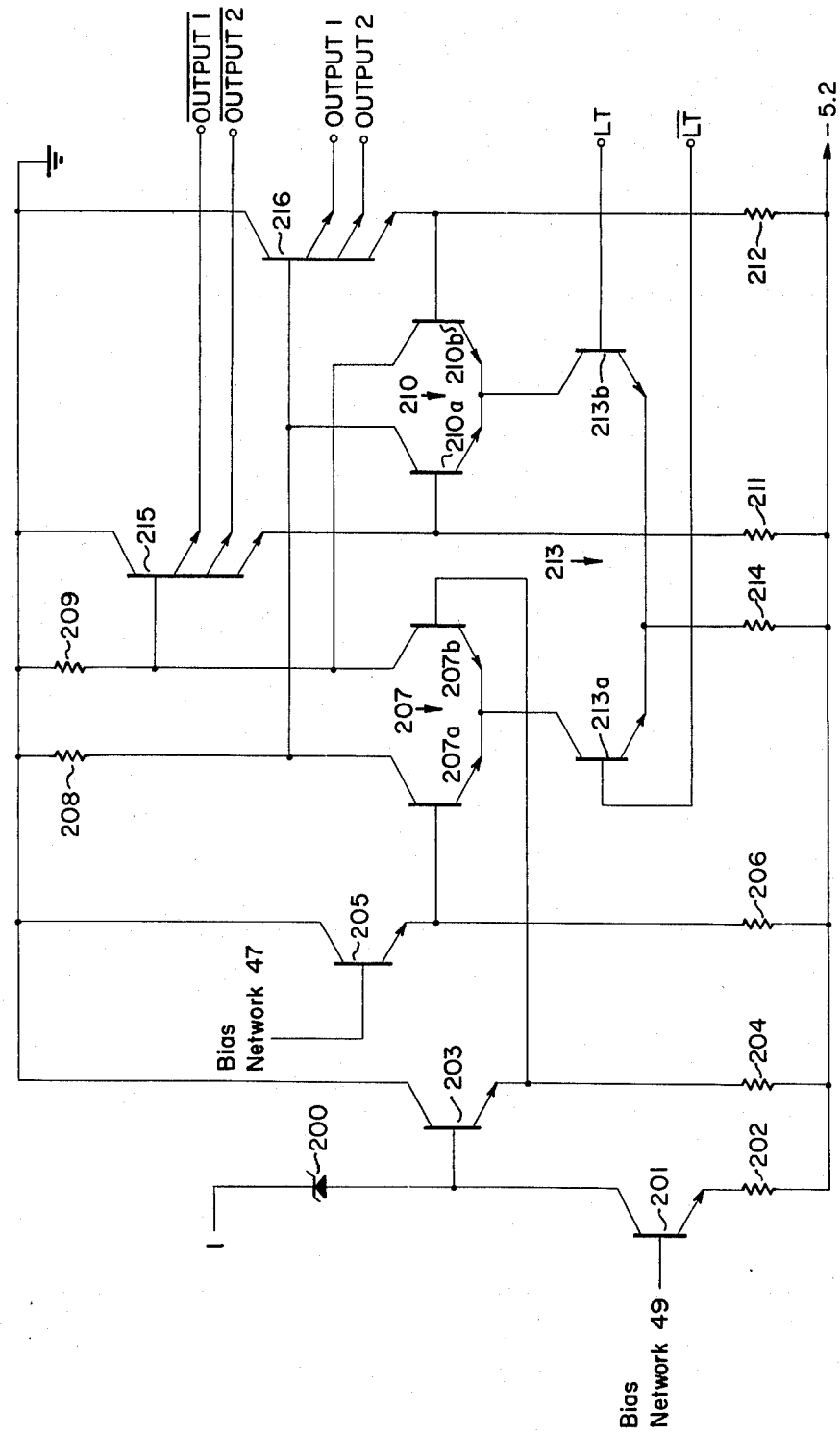
FIG. 15 is a schematic circuit diagram illustrating output latch and level shift networks 46a–46e for shifting the output logic levels.

Referring more specifically to FIG. 15, an output latch and level shift network 46a is now discussed in detail. The cathode electrode of level shifting zener diode 200 is connected to an input terminal I and the anode electrode is connected to the collector electrode of a level shift current source illustrated here as a transistor 201. The base electrode of the transistor 201 is connected to a bias 4 network and the emitter electrode is connected to −5.2 volts through a bias resistor 202.

The base electrode of an emitter follower transistor 203 is connected to the anode electrode of the level shifting diode 200. The collector electrode of the transistor 203 is connected to ground potential and the emitter electrode is connected to −5.2 volts through a bias resistor 204. A second emitter follower transistor 205 has its collector electrode connected to ground potential and its base electrode to a reference bias network 47. The emitter electrode of the transistor 205 is connected to −5.2 volts through a bias resistor 206.

A differential current switch includes first and second transistors 207a and 207b, having their emitter electrodes connected together. The base electrodes of the transistors 207a and 207b are connected to the emitter electrodes of transistors 205 and 203, respectively. The collector electrodes of the transistors 207a and 207b are connected to ground potential through resistors 208 and 209, respectively.

A differential current switch 210 includes first and second transistors 210a and 210b, respectively, having their emitter electrodes connected together. The collector electrode of the transistor 210a is connected to the collector electrode of the transistor 207a. The collector electrode of the transistor 210b is connected to the collector electrode of the transistor 207b. The current switch 210 provides the positive feedback for the output latch portion of the present circuit.

A differentially switched current source 213 includes first and second transistors 213a and 213b having their emitter electrodes connected together, and the junction connected to −5 volts through a voltage setting resistor 214. The collector electrode of the transistor 213a is connected to the emitter electrodes of the differential current switch 207. The collector electrode of the transistor 213b is connected to the emitter electrodes of the differential current switch 210. The base electrode of the transistor 213b is connected to a first control terminal labeled LT. The base electrode of the transistor 213a is connected to a second control terminal labeled $\overline{LT}$.

The base electrode of the transistor 210a is connected to −5 volts through a bias resistor 211. The emitter electrode of the transistor 210b is connected to −5.2 volts to a bias resistor 212.

A first output emitter follower illustrated here as a transistor 215 having triple emitters, has its collector electrode connected to ground potential and its base electrode connected to ground potential through the bias resistor 209. The first emitter of the transistor 215 is connected to an output terminal labeled $\overline{OUTPUT\ 1}$. The second emitter electrode is connected to a second output terminal labeled $\overline{OUTPUT\ 2}$. The third emitter of the transistor 215 is connected to the base of transistor 210a. A triple emitter transistor is utilized here in order that the individual output terminals, $\overline{OUTPUT\ 1}$ and $\overline{OUTPUT\ 2}$ may be individually wire-ORed with other output terminals to simplify the interconnection of several quantizers.

A second output emitter follower illustrated here as a transistor 216 having triple emitter electrodes has its collector electrode connected to ground potential and its base electrode connected to ground potential through the bias resistor 208. The first emitter electrode of the transistor 216 is connected to the first terminal of the second output pair, labeled OUTPUT 1. The second emitter electrode of the transistor 216 is connected to the second output terminal of the second output terminal pair labeled OUTPUT 2. The third electrode is connected to the base electrode of transistor 210b.

The operation of the output latch and level shift network of FIG. 15 is now discussed with respect to that figure.

The output latch and level shift network 49a provides a level shifted output by generating a reference voltage which represents the mid-point of the difference between the logic 1 and logic 0 output states of the logic networks. The zener diode 200 shifts the level of the incoming logic signal. The emitter-follower transistor 203 buffers the signal between the diode 200 and the base of the transistor 207d. The reference level of the transistor 207a is set by a reference voltage R through the transistor 205. The voltage R is set at the mid-point of the logic swing between the 0 and 1 logic states generated by the transistor 263. Thus, when a logical state is applied to the input I, the base of the transistor 203 will be more positive than the base of the transistor 20b by approximately 200 millivolts. Therefore, the base of the transistor 207b will conduct switch-current through the transistor 213a if a logic 1 signal is applied to the base electrode of the transistor 213a. The emitter follower transistor 216 in turn provides the logic 1 output signal.

If a logic 0 state is applied to level shifting diode 200, the transistor 207a will conduct current through the resistor 208 and the transistor 213a if a logic 1 signal is applied to the base of that transistor. Thus, a logic 1 output state is provided by the emitter-follower 215.

The input signals LT and $\overline{LT}$, generated in the output latch clock driver network 48, provide a temperature-compensated voltage across the resistor 214 in order to maintain a bias current that is relatively insensitive to temperature level. If the signal LT is greater than the signal $\overline{LT}$, the differential current switch transistor 213b causes positive feedback through the transistor 210a, the emitter-follower 216, the transistor 210b, the emitter-follower 215 and back to the transistor 210a.

This positive feedback causes a bi-stable latching action to occur and allows the use of the output stage as a data storage register.

Thus, a logic 1 input signal to the diode 200 and a logic 1 signal to the transistor 213a results in a logic 1 output signal from the emitter follower 216 and a logic 0 output signal from the emitter follower 215. A logic 0 input signal to the diode 200 and a logic 1 signal to the transistor 213 results in logic 1 and 0 signals from transistors 215 and 216, respectively. It can further be seen that a logic 1 signal applied to the transistor 213b places the output latch network in the latch mode which stores the output states that were previously provided. As the control signal to the transistor 213a rises above the signal to the transistor 213b, the output latch network is returned to track mode until the next latching cycle.

Referring briefly to FIG. 17, a bias network 47 is now described. A reference current source illustrated here as a transistor 220 has its base electrode connected to ground potential and the emitter electrode is connected to −2 volts through a bias resistor 221. The collector electrode is connected to +5 volts through a bias resistor 222. A level shift current source illustrated as a transistor 223 has its emitter electrode connected to −5.2 volts through a bias resistor 224. The base electrode is connected to an input terminal for receiving a bias voltage from the bias network 49. The collector electrode of the transistor 223 is connected to the anode electrode of a level shifting zener diode 225 and to an output terminal.

An output emitter follower 226 has its collector and base electrodes connected across the bias resistor 222 and the collector is connected to +5 V. The emitter electrode of the resistor 226 is connected to the cathode electrode of the diode 225.

The operation of the bias network 47 is now described.

The bias network 47 generates a logic level which represents the midpoint between logic levels of all of the logic gates 40, 41, 42 and 43. This midpoint reference level is then level-shifted in a manner identical to the level shifters in the output stages and provides a common bias that is used to track out the drifts caused by power supply and temperature variations. This is accomplished by use of accurately matched components such as zeners and transistors. The logic reference voltage output is generated by passing a current, generated by a current source of transistor 220 and resistor 221, through a resistor 222 whose resistance is one half that of the load resistor in the logic circuits. Thus the resistor 222 generates a voltage that is one half the voltage swing that would normally occur in the logic gates. Transistor 226 is then used to level shift and isolate this reference level as was done in each of the logic gates. The zener 225 is used to level shift the voltage at the emitter electrode of the transistor 226 to a voltage which represents the midpoint of the level shifted logic outputs.

Referring more specifically to FIG. 17, an output latch clock driver network 48 is now described in detail. A bias resistor 230 is connected between +5 volts and the collector and base electrodes of a first diode-connected transistor 231. The emitter electrode of the transistor 231 is connected to the collector and base electrodes of a second diode-connected transistor 232. The emitter electrode of the transistor 232 is connected to the cathode electrode of a bias compensation zener diode 233. The anode electrode of the diode 233 is connected to the collector and base electrodes of a third diodeconnected transistor 234. The emitter electrode of the transistor 234 is connected to −5.2 volts through a bias resistor 235.

An emitter follower voltage generator illustrated here as a transistor 236 has its collector connected to +5 V and its base electrode is connected to the base and collector electrodes of transistor 231.

A differential current switch 237 includes first and second transistors 237a and 237b, respectively, having their emitter electrodes together. The collector electrodes of the transistors 237a and 237b are connected to the emitter electrode of the transistor 236 through resistors 238 and 239, respectively. The base electrode of the transistor 237a is connected to an input terminal which receives the output latch clock signal, labeled OLC, from an external timing network 50 (FIG. 1). The base electrode of the transistor 237b is connected to an input terminal which receives the $\overline{OLC}$ timing signal from the timing network 50.

The emitter electrodes of the transistors 237a and 237b are connected to the collector electrode of a current source illustrated here as a transistor 240. The emitter electrode of the transistor 240 is connected to −5.2 V through a bias resistor 241, and the base electrode is connected to the collector and base electrodes of the transistor 234.

A first output emitter follower 242 has its base electrode connected to the collector electrode of the transistor 237a, and its collector electrode connected to +5 volts. The emitter electrode of the transistor 242 is connected to the cathode electrode of an output level shifting zener diode 243. The anode electrode of the diode 243 is connected to −5.2 volts through a resistor 244. The anode electrode is also connected to an output terminal which provides the control signal, labeled $\overline{LT}$, to the output latch networks 46a–46e.

A second output emitter follower 245 has its base electrode connected to the collector electrode of the transistor 237b and its collector electrode connected to +5 volts. The emitter electrode is connected to the cathode electrode of a second output level shifting zener diode 246. The anode electrode of the diode 246 is connected to −5.2 volts through a resistor 247. The anode electrode of the diode 246 is also connected to an output terminal which provides the timing signals, labeled LT, to the output networks.

The operation of the output latch clock driver network, according to FIG. 17, is now described with reference to that figure.

The output latch clock driver performs the function of translating the standard emitter coupled logic levels; i.e., −0.9 to −1.7 V swings at the input interface to the logic levels required in the LT and $\overline{LT}$ input terminals of the output latch level shift stages. In order to allow the output latch level shift circuit to have adequate common mode range for the worst case temperature and power supply variations, this circuit also has to provide very accurate voltage levels so as to set the bias current in the output latch stage to the proper level, thus controlling the final output swings. This circuit provides bias levels that set the output current swing and the output latch stage to be essentially independent of temperature. The output latch clock and output latch clock OLC and $\overline{OLC}$ inputs are provided from an external source at standard emitter coupled logic levels to the bases of transistors 237a and 237b. Thus, when the OLC input is more positive than the $\overline{OLC}$ input, in other words a "1" input state, then transistor 237a will conduct and the current generated by transistor 240 and resistor 241 will pass through resistor 238 providing a "0" or lower output to the base of transistor 242. Likewise, if the $\overline{OLC}$ input signal is a logic "1" state, i.e. more positive than the OLC input signal, transistor 237b conducts current through the resistor 239, thereby setting the base of transistor 245 at a lower state. The active bias level in the output latch stage is set when the LT input signals are in the "1" state or in the highest state, thus the LT output signals are in the corresponding high state.

The LT and $\overline{LT}$ output signals are generated by the diodes 243 and 246; the transistors 236, 242 and 245; and resistors 238 and 239. The voltage on the base electrode of transistor 236 is the ultimate control of the voltage outputs at LT or $\overline{LT}$ when they are in the "1" state. The base voltage is set by the series combination of transistors 231, 232, 234, zener 233, and resistors 230 and 235. Thus, the LT voltage will be essentially the voltage across R235 plus the voltage across the diode-connected transistor 234. When the output signal LT voltage applied to the output latch network (FIG. 15) is in the high state, there is one additional diode drop at the base-emitter junction of transistor 213b, and thus the voltage across resistor 214 in the output latch stage will be equivalent to the voltage drop across resistor 235. Likewise, if the $\overline{OLC}$ signal is in the "1" state, the $\overline{LT}$ output signal, which will be the high state, and the transistor 213a set the voltage across resistor 214 to be the same as resistor 235 in the output latch clock driver stage. The clock driver thus controls the current through the output latch and level shift output stage and thus the logic swing of the quantizer output. By using the tracking and matched zener and transistor characteristics, the sensitivity to temperature is thus minimized from the output logic swing. The resistors 247 and 244 set the bias currents through transistors 245 and 246, respectively. Also it is noted that the current through transistor 240 which controls the swing of the voltages at LT and $\overline{LT}$ is also controlled via the voltage drop across resistor 235 and the drop across the diode-connected transistor 234.

Referring now to FIG. 18, a bias network 49 is now described in detail. A first transistor 250 has its collector electrode connected to ground potential, and the base electrode connected to one terminal of a resistor 251.

The second terminal of the resistor 251 is connected to ground potential. A second transistor 252 has its collector electrode connected to the first terminal of the resistor 251 and its base electrode connected to the emitter electrode of the transistor 250. The emitter electrode of the transistor 252 is connected to the collector electrode of the diode-connected transistor 254 through a resistor 253. The emitter electrode of the transistor 254 is connected to −5.2 volts.

The collector electrode of a diode-connected transistor 255 is connected to the base electrode of the transistor 252. The emitter electrode is connected to the collector electrode of the transistor 254 through a resistor 256. The emitter electrode of the transistor 255 is also connected to an output terminal.

Figure 16:
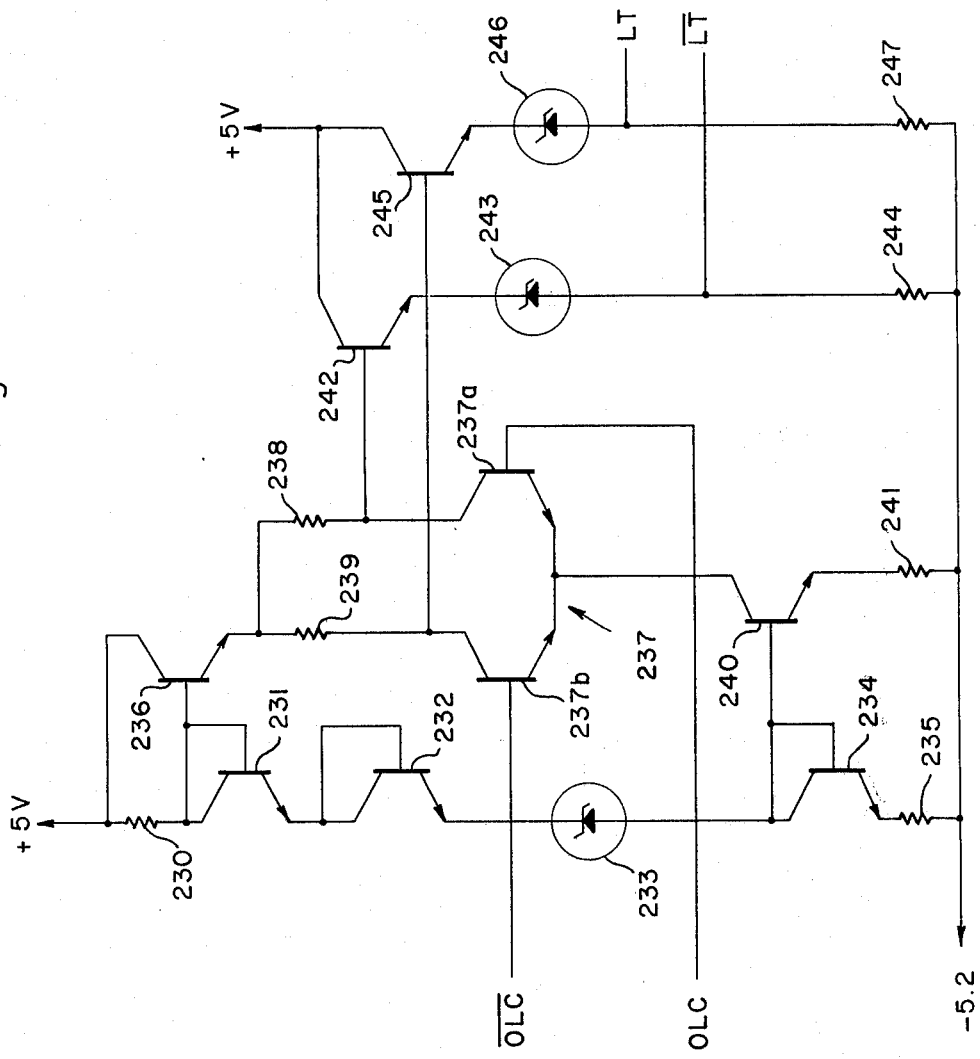
FIG. 16 is a schematic circuit diagram illustrating an output latch bias network 47.

The operation of the bias network 49 is similar to the operation of the circuit according to FIG. 16 and therefore will not be described in greater detail. The difference between the two bias networks is that the output signal from the network 49 is level shifted with respect to the network 47.

The network of FIG. 19 illustrates a five-bit analog digital converter having two quantizer networks 10a and 10b. An input reference network includes series-connected resistors 300–304 connected between plus and minus reference voltages. Input amplifiers 305–309 are connected to the respective resistor junction points. The amplifiers are in turn connected to the negative input terminals of the quantizers 10a and 10b. The analog input terminals of the quantizers 10a and 10b are connected together and receive the same input signal. The output terminals exclusive of the position-bit output terminal of the quantizer 10a are connected with the corresponding output terminals of the quantizer 10b. The position bit output terminal of the quantizer 10b provides the most significant bit output signal. Thus a 5-bit output signal is provided by two quantizers.

Figure 20:
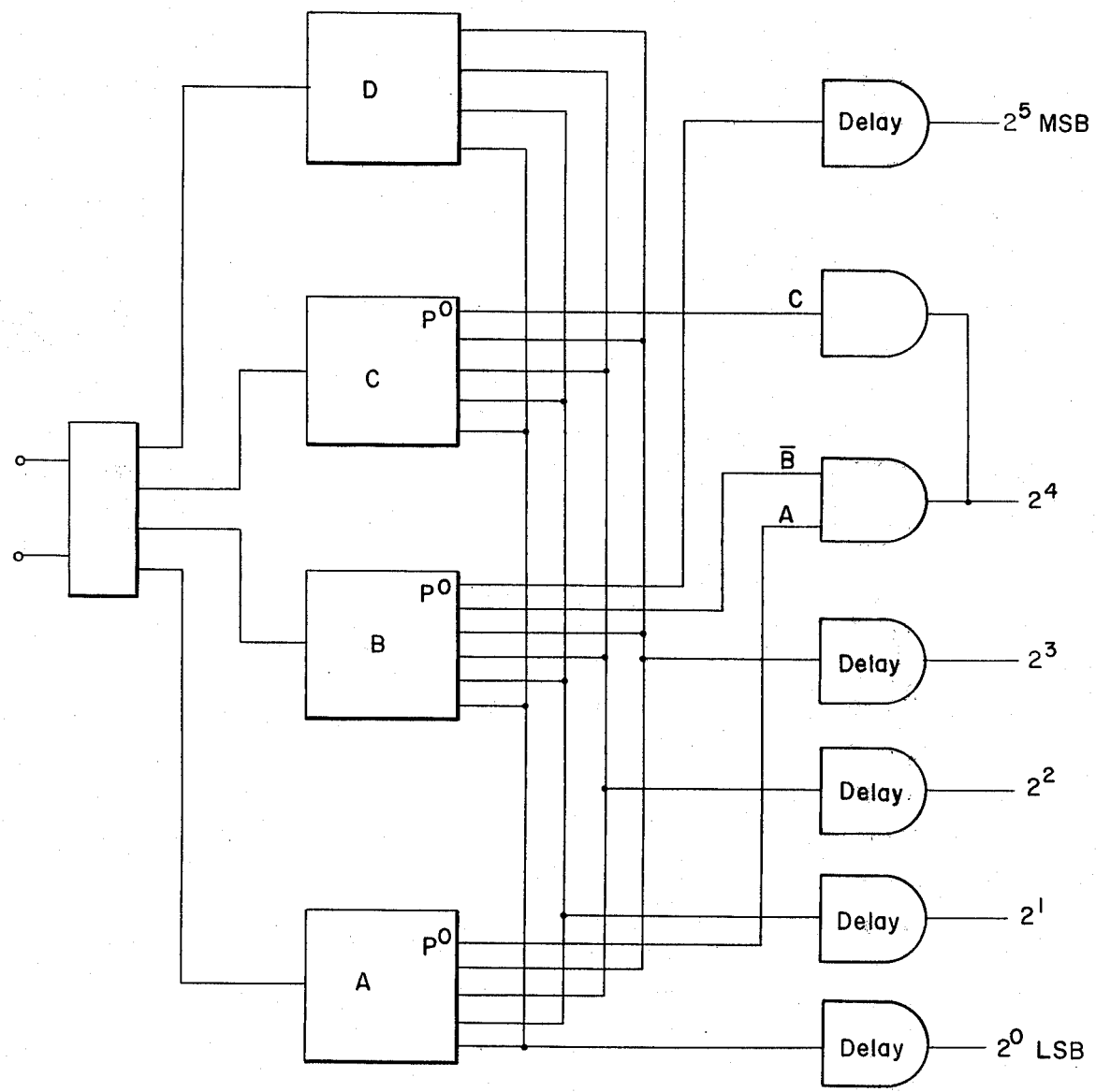
FIG. 20 is a schematic block diagram illustrating a 6-bit encoder.

Referring more specifically to FIG. 20, a six-bit analog digital converter is disclosed. Four quantizers, labeled A, B, C, and D, are connected together in parallel and receive an analog input signal. The four least significant bits of the four quantizers are respectively wire-ORed connected and provide the LSB output of the converter. The two most significant bits are provided by the position bit output terminals of the quantizers A, B, and C. Thus the two output terminals of the position bit of the quantizer A is connected to an AND gate and the false position bit output terminal of the quantizer B is connected to the second terminal of the AND gate. The signal A B is wire-ORed connected with the true position bit output terminal of the quantizer C and provides the second most significant bit $2^4$. The true position bit output terminal of the quantizer D provides the most significant bit. The delay networks provide a stage delay in order that the six output bits be applied to the succeeding circuitry at the same time.

Table 2 illustrates several analog-to-digital converters which may be designed utilizing a plurality of quantizer networks and appropriate decoding logic circuitry.

TABLE 2

| | PARALLEL COMPARATOR ARRAY ENCODERS | | |
|---|---|---|---|
| | | MSBs | LSBs Wire-OR |
| # Bits | # Quantizers | Decoder Requirements | Connected |
| 4 | 1 | None | Yes |
| 5 | 2 | None | Yes |
| 6 | 4 | 2-bit uniary to binary | Yes |

TABLE 2-continued

| | PARALLEL COMPARATOR ARRAY ENCODERS | | |
|---|---|---|---|
| | | MSBs | LSBs Wire-OR |
| # Bits | # Quantizers | Decoder Requirements | Connected |
| 7 | 8 | 3-bit uniary to binary | Yes |
| 8 | 16 | 4-bit uniary to binary | Yes |

It should be apparent from the foregoing that the present invention provides a high-speed quantizer which may be used as an analog-to-digital converter providing four output bits or may be used in a plurality of quantizers for providing more than four output bits. Moreover, a quantizer uses $2^N$ differential amplifiers coupled to $2^{N-1}+1$ latch networks and $2^{N-1}+1$ logic gates. Prior art analog-to-digital converters have utilized $2^N$ comparators latches and logic gates for providing the same speed and resolution where N is the number of output bits.

Although the present invention has been shown and described with reference to particular embodiments, nevertheless various changes, modifications, obvious to one skilled in the art to which the invention pertains are deemed to lie within the purview of the invention.

What is claimed is:

1. An analog to digital converter for quantizing an analog input signal into $2^N$ quantization levels of increasing significance, adjacent levels being separated by a quantization differential, said converter converting each level into an output code comprising:

a first resistive network for providing said $2^N$ quantization levels;

a second resistive network coupled to receive said analog input signal;

$2^N$ differential amplifiers, each coupled to said first and second resistive networks, each responsive to said analog input signal for comparing said input signal with one of said $2^N$ levels to provide a binary output signal for the levels that are exceeded, said differential amplifiers forming first and second sections each including half of the $2^N$ differential amplifiers, said first section having a greater order of significance than said second section, the differential amplifiers of each section having a sequential order of significance varying from a most to a least significant level for the section;

$2^{N-1}-1$ latches, each latch having first and second inputs for respectively setting said latches in first and second states, with said $2^{N-1}-1$ latches each having said first and second inputs respectively coupled to a different pair of differential amplifiers of the same order of significance, said pair being a differential amplifier in each of said first and second sections, a position latch and a most significant bit latch each having an input for being set to a first binary state and having their respective inputs coupled to the differential amplifier of the most significance in the respective first and second sections, said $2^{N-1}-1$ latches and said most significant bit latch each representing one of the cyclic bit positions of a cyclic code having $2^N$ code numbers, said position latch representing the cyclic state of an overflow code number, and said most significant bit latch representing the most significant bit position of said cyclic code, said cyclic code changing the state of only one cyclic bit position between sequential cyclic code numbers, the bit positions of each of said $2^{N-1}-1$ latches and said most significant bit latch having a first binary state for half of the $2^N$ code numbers and a second binary state for the other half of the $2^N$ code numbers, each of said $2^{N-1}-1$ latches changing binary states in response to the corresponding differential amplifier of the same significance in the first or the second sections, said position latch and said most significant bit latch each changing binary state in response to the corresponding differential amplifier of said respective first and second sections, and binary encoding means coupled to said latches to provide an N bit binary code and a position bit, said position bit being at said second binary state for said $2^N$ code numbers and changing to said first binary state for said overflow code number;

reset means coupled to said $2^{N-1}-1$ latches to said position latch and to said most significant bit latch and for periodically resetting said latches;

whereby said $2^{N-1}-1$ latches which are triggerable to opposite states in response to different quantization levels are triggered in response to input signal levels separated by half of the $2^N$ quantization levels.

2. The combination of claim 1 in which N is equal to 4 and the binary output code has bits 1-4 of increasing significance, said $2^{N-1}-1$ latches are latches 1-4 and 6-8 respectively being of increasing significance from the least significant bit position of said cyclic code, said most significant bit latch is latch 5 and the position bit latch is latch 9, in which said binary encoding means includes exclusive OR gates 1-4, exclusive OR and AND circuits 1-3 and an AND gate and delay means, said first exclusive OR gate being coupled to latches 1 and 2, said second exclusive OR gate being coupled to latches 3 and 4, said third exclusive OR gate being coupled to latches 2 and 4 and said fourth exclusive OR gate being coupled to latches 6 and 7, said exclusive OR and AND circuit 1 being coupled to latches 5, 7 and 9, said exclusive OR and AND circuit 2 being coupled to latches 4, 5 and 9 and said exclusive OR and AND circuit 3 being coupled to latches 5, 8 and 9, said AND gate being coupled to latches 5 and 9 and said delay means being coupled to latch 9, said exclusive OR gates 1, 2 and 4 and exclusive OR and AND circuit 3 each having an output with said outputs coupled to provide an OR function which represents the bit 4 of said binary output code, said exclusive OR gate 3 and said exclusive OR and AND circuit 1 each having an output with said outputs coupled to provide an OR function which represents bit 3 of said binary output code, said exclusive OR and AND circuit 2 having an output representing bit 2 of said binary output code, said AND gate having an output providing bit 1 of said binary output code, and said delay means having an output providing said position bit.

3. An analog to digital converter for quantizing an analog input signal into $2^N$ quantization levels of increasing significance each level separated by a quantization differential and for converting each level into an N bit output code comprising:

a resistive reference network for providing said $2^N$ quantization levels;

a resistive signal network coupled to receive said analog input signal;

$2^N$ differential amplifier means each coupled to said resistive reference network and said resistive signal network for comparing said analog input signal with said $2^N$ levels to determine which are exceeded, said $2^N$ differential amplifier means forming first and second sections, said differential amplifier means representing for each section a range of order of significance varying between most and least significance;

$2^{N-1}-1$ latching means each coupled to two of said differential amplifier means, one in each of said first and second sections and of the same relative order of significance in both sections;

a position latching means and a most significant latching means respectively coupled to the differential amplifier means of most significance in said first and second sections, each of said $2^{N-1}-1$ latching means and said most significant latching means providing output signals representing a cyclic bit position of different significance of a cyclic code having a count of N sequential code numbers, said position latching means representing the count of said cyclic code exceeding said N sequential code numbers, said cyclic code changing the state of only one cyclic bit position between sequential cyclic code numbers, and encoding means responsive to said latching means to provide said N bit output code and a position bit, whereby each of said $2^{N-1}-1$ latching means changes states in response to differential amplifier means responding to quantization levels that are separated by half of the $2^N$ quantization levels.

4. An analog to digital converter for quantizing analog input signals into $2^N$ levels and converting each level into a N-bit output code comprising:

a resistive reference network being divided into first and second sections;

a resistive signal network responsive to said analog input signals and being divided into first and second sections;

$2^N$ differential amplifier means representing $2^N$ quantization levels and divided into first and second groups respectively coupled to said first and second sections, the differential amplifier means of each group having a group order of significance;

$2^{N-1}-1$ latching means each coupled to a pair of said differential amplifier means with each pair being a differential amplifier means in both said first and second groups and of the corresponding group order of significance;

a position bit latching means and a most significant bit latching means respectively coupled to the differential amplifier means of the most group order of significance in said first and second groups;

said $2^{N-1}-1$ and said most significant bit latching means developing binary output signals representative of a cyclic code having a bit position for each latching means and having a count of $2^N$ states each count representing a sequential code number, said position bit latching means developing a binary output signal representative of the count exceeding said $2^N$ states, said $2^{N-1}-1$ latching means changing to opposite states in response to the analog input signal changing level an amount equal to half of the $2^{N-1}$ quantization levels;

reset means coupled to said $2^{N-1}-1$, said most significant bit latching means and said position bit latching means for periodically resetting said latching means; and encoding means responsive to said $2^{N-1}-1$ and said most significant bit latching means for encoding each of said $2^N$ states of said cyclic code into a unique number of said N bit output code.

5. The combination of claim 4 in which N is 4 and $2^{N-1}-1$ latching means are latching means first to seventh respectively representing an increasing order of significance of said cyclic code bit positions and said most significant bit latching means represents the most significant of said cyclic code bit positions, and in which said N bit output code has first, second, third and fourth output bits of increasing order of significance and in which said encoding means includes first, second, third and fourth exclusive OR gates, first, second and third Y circuits, each providing an exclusive OR function combined with an AND function, and AND gate and a delay circuit, said first exclusive OR gate being coupled to said first and second latching means, said second exclusive OR gate being coupled to said third and fourth latching means, said third exclusive OR gate being coupled to said second and fourth latching means and said fourth exclusive OR gate being coupled to said fifth and sixth latching means, said first Y circuit being coupled to said most significant bit, said sixth and said position bit latching means, said second Y circuit being coupled to said fourth, said most significant bit and said position bit latching means and said third Y circuit being coupled to said seventh, said most significant bit and said position bit latching means, said AND gate being coupled to said most significant bit and said position bit latching means, and said delay circuit being coupled to said position bit latching means;

means coupled to outputs of said first, second and fourth exclusive OR gates and said third Y circuit to OR the outputs therefrom and provide said first binary output bit;

means coupled to said third exclusive OR gate and said first Y circuit to OR the outputs therefrom and provide said second binary output bit; and said second Y circuit, said AND gate and said delay circuit each having outputs to respectively provide said third binary output bit, said fourth binary output bit and a position bit.

6. An analog to digital converter for quantizing analog input signals and providing a binary output code comprising:

a reference divider network of a series of resistors of value R and having reference taps therealong of increasing significance for providing threshold voltages with the voltage between adjacent reference taps being the quantization differential, said reference divider network having first and second sections each including a group of reference tap points, a signal divider network of a series of resistors of value R and having signal taps therealong of increasing significance, said signal divider network having first and second sections each including a group of signal tap points, $2^N$ differential amplifiers forming first and second groups thereof, the differential amplifiers of each group having a similar relative order of significance, each differential amplifier having a first and second input terminal respectively coupled to a reference and a signal tap point for corresponding first and second sections of said reference and signal divider networks and of the same relative order of significance for providing a quantized signal, said differential amplifiers each drawing equal bias currents at said first and second input terminals, $2^{N-1}-1$ latching means coupled to $2^{N-1}-1$ differential amplifiers of least significance in said first and second groups, each coupled to a differential amplifier in both said first and second groups of the same relative order of significance, a position bit latching means and a most significant bit latching means respectively coupled to the differential amplifier of the most order of significance in the first and second groups said $2^{N-1}-1$ and said most significant bit latching means providing output signals representative of a cyclic code of $2^N$ sequential code numbers with each one of said $2^{N-1}-1$ and said most significant bit latching means representing the cyclic bit position of a different significance of said cyclic code, said cyclic code changing the binary state of only one bit position between adjacent sequential code numbers, said bit positions each having a first binary state for one half of said $2^N$ sequential code numbers and a second binary state for the remainder of the code numbers, each of said $2^{N-1}-1$ latching means changing state only twice for said cyclic code at sequential code numbers separated by one half of said $2^N$ code numbers, and encoding means responsive to said latching means to provide a binary output code, whereby each of said $2^{N-1}-1$ latching means responds to a differential level that is a function of the differential quantization levels included between the tap points of corresponding significance of the first and second sections of said reference and signal divider networks.

7. An analog to digital converter for quantizing analog input signals into $2^N$ levels and converting each level into an N-bit code comprising:

a resistive reference network having a series of directly connected resistors of value R, each reference network having reference tap points between the directly connected resistors and providing bias currents;

a resistive signal network having a series of directly connected resistors of value R and being responsive to said analog input signals, each signal network having signal tap points between the directly connected resistors and bias currents;

$2^N$ differential amplifier means representing $2^N$ quantization levels and being divided into first and second groups, each differential amplifier means having first and second input terminals, each differential amplifier means of said first and second groups respectively coupled to reference tap points and signal tap points of said respective resistive reference network and said resistive signal network, the differential amplifier means of each group having a group order of significance, each of said differential amplifier means cancelling error voltages developed by bias currents in said reference network and said signal network;

$2^{N-1}-1$ latching means each coupled to a different differential amplifier means in both said first and second groups and of the corresponding group order of significance, the coupling being to all of said differential amplifier means in each group except the two differential amplifier means of most group order of significance;

a position bit latching means and a most significant bit latching means respectively coupled to the differential amplifier means of most group significance in said first and second groups, said $2^{N-1}-1$ latching means and said most significant bit latching means developing binary output signals representative of a cyclic code having a bit position of different significance for each latching means and having $2^N$ count states each represented by a sequential code number and in which only one bit changes binary state at a time between sequential code numbers, said position bit latching means representing that the count state exceeds said $2^N$ count states, and encoding means responsive to said $2^{N-1}-1$ latching means and said most significant bit latching means for encoding each of said code numbers of said cyclic code into a unique number of said N bit code.

8. An analog encoder for providing quantized voltages in an analog to digital converter responsive to a source of analog input signals comprising:

a plurality of sources of reference potential, a reference network coupled to said plurality of sources of reference potential and having a plurality of resistors directly connected in series each having an equal value R with quantized reference tap points therebetween, with each reference tap point having a relative order of significance, a signal network coupled to said source of analog input signals and having a plurality of resistors of equal value R directly connected in series with signal tap points therebetween, with each signal tap point having a relative order of significance, a plurality of differential amplifiers, each having first and second input terminals respectively coupled to tap points of corresponding order of significance of said reference network and said signal network and passing equal bias currents through said first and second inputs of said differential amplifier, each of said differential amplifiers responding to the difference between the voltage at the reference tap point and the voltage at the signal tap point to provide the quantized voltage of a different order of significance, and each of said reference tap points having an error voltage provided by bias currents in said reference network and each of said signal tap points having an error voltage provided by bias currents in said signal network that is equal to the error voltage of the corresponding reference tap point, whereby the quantized voltages at the outputs of said differential amplifiers are substantially unaffected by the error voltages caused by the bias currents in said signal network and said reference network.

9. An analog encoder for providing quantized voltages in an analog to digital converter responsive to a source of analog input signals comprising:

a plurality of sources of reference potential;

a reference network coupled to said plurality of sources of reference potential and having a plurality of resistors each of value R directly connected in series, with quantized reference tap points therebetween, each tap point having a relative order of significance;

a signal network coupled to said source of analog input signals and having a plurality of resistors, each of value R directly connected in series, with signal tap points therebetween, each tap point having a relative order of significance;

a plurality of differential amplifiers, each having first and second inputs respectively coupled to reference tap points and signal tap points of corresponding order of significance and passing equal bias currents through said first and second inputs of said differential amplifier, each of said differential amplifiers responding to the difference between the voltage at the reference tap point and the voltage at the signal tap point for providing said quantized output voltages, and the bias currents in said reference network and said signal network providing an error voltage at each of said reference and signal tap points, said tap points of the same relative order of significance having equal error voltages, whereby the quantized voltages at the outputs of said plurality of differential amplifiers are substantially unaffected by the error voltages caused by the bias currents in said signal network and said reference network.

10. An analog encoder for providing quantized output voltages in response to a source of analog input signals comprising:

a plurality of differential amplifiers each having first and second input terminals and providing substantially equal impedance characteristics to current passing through said terminals;

a resistive reference network having a plurality of resistors directly connected in series, each of value R and having a plurality of quantized reference tap points therealong, each tap point being between two directly connected resistors, each tap point having a relative order of significance and each coupled to the first input terminal of a different differential amplifier and providing a bias current through said first input terminal; and a resistive signal network coupled to said source of analog input signals, said resistive signal network having a plurality of resistors directly connected in series, each of value R, and having a plurality of quantized signal tap points therealong, each tap point being between two directly connected resistors, each tap point having a relative order of significance and each coupled to the second input terminal of a differential amplifier being coupled to the tap point of said reference network of corresponding order of significance, each tap point providing a bias current, during the presence and the absence of an analog input signal, through the second input terminal equal to the bias current through the first input terminal of the corresponding differential amplifier;

said bias currents for each differential amplifier developing substantially equal error voltages at the first and second input terminals of that differential amplifier, whereby the quantized output voltages from said differential amplifiers are substantially independent of the error voltages caused by the bias currents in said resistive reference network and said resistive signal network.

11. The combination of claim 10 further including connecting means coupled from said source of analog signals to the ends of said plurality of series connected resistors of said resistive signal network and to at least one intermediate point between the ends of said plurality of series connected resistors.

* * * * *